United States Patent
Lee et al.

(10) Patent No.: US 11,917,862 B2
(45) Date of Patent: Feb. 27, 2024

(54) DISPLAY APPARATUS, ELECTRONIC DEVICE INCLUDING THE SAME, AND METHOD OF MANUFACTURING THE DISPLAY APPARATUS

(71) Applicant: Samsung Display Co., Ltd., Yongin-si (KR)

(72) Inventors: Wonse Lee, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 206 days.

(21) Appl. No.: 17/585,232

(22) Filed: Jan. 26, 2022

(65) Prior Publication Data

US 2023/0030096 A1 Feb. 2, 2023

(30) Foreign Application Priority Data

Aug. 2, 2021 (KR) .......................... 10-2021-0101529

(51) Int. Cl.
*H10K 59/121* (2023.01)
*H10K 59/122* (2023.01)
*H10K 71/00* (2023.01)
*H10K 59/12* (2023.01)

(52) U.S. Cl.
CPC ....... *H10K 59/1213* (2023.02); *H10K 59/122* (2023.02); *H10K 71/00* (2023.02); *H10K 59/1201* (2023.02)

(58) Field of Classification Search
CPC .................... H10K 59/1213; H10K 59/122
USPC ............................................. 257/40
See application file for complete search history.

(56) References Cited

U.S. PATENT DOCUMENTS

| 9,164,211 B2 * | 10/2015 | Yim ................... G02B 5/3083 |
| 9,985,080 B2 * | 5/2018 | Choi .................... H10K 71/00 |
| 10,910,454 B2 | 2/2021 | Takechi et al. |
| 2017/0221976 A1 * | 8/2017 | Park .................... H10K 50/844 |
| 2019/0081126 A1 * | 3/2019 | Naganuma ........... H10K 59/131 |

FOREIGN PATENT DOCUMENTS

| CN | 110707228 A | 1/2020 |
| KR | 10-1096719 B1 | 12/2011 |
| KR | 10-1338250 B1 | 12/2013 |
| KR | 10-2016-0017388 A | 2/2016 |
| KR | 10-2019-0026351 A | 3/2019 |

* cited by examiner

*Primary Examiner* — Xia L Cross
(74) *Attorney, Agent, or Firm* — Lewis Roca Rothgerber Christie LLP

(57) ABSTRACT

A display apparatus including a first display area, a second display area including a transmissive area, and a peripheral area outside the first display area and the second display area. The display apparatus includes a substrate, a first pixel circuit on the substrate and in the first display area, and an organic insulating layer on the first pixel circuit and covering the first display area and the second display area. A thickness of the organic insulating layer in the second display area is less than a thickness of the organic insulating layer in the first display area.

23 Claims, 23 Drawing Sheets

DISPLAY APPARATUS, ELECTRONIC DEVICE INCLUDING THE SAME, AND METHOD OF MANUFACTURING THE DISPLAY APPARATUS

CROSS-REFERENCE TO RELATED APPLICATION

This application claims priority to and the benefit of Korean Patent Application No. 10-2021-0101529, filed on Aug. 2, 2021, in the Korean Intellectual Property Office (KIPO), the entire disclosure of which is incorporated by reference herein.

BACKGROUND

1. Field

One or more embodiments relate to a display apparatus, an electronic device including the same, and a method of manufacturing the display apparatus.

2. Description of the Related Art

Display apparatuses visually display data. Recently, display apparatuses have been used for various purposes. As thicknesses and weights of display apparatuses have decreased, the range of applications of display apparatuses has increased.

In order to increase an area occupied by a display area and add various functions to the display area, research has been conducted into a display apparatus having an area for adding various functions other than image display inside the display area.

Organic light-emitting display apparatuses, from among various display apparatuses, have the advantages of a wide viewing angle, excellent contrast, and fast response, and thus the range of applications of organic light-emitting apparatuses has increased.

SUMMARY

In related art, during a process of manufacturing a display apparatus, impurities such as gas generated in an organic layer included in the display apparatus may penetrate into a light-emitting device (e.g., an organic light-emitting diode), thereby degrading the light-emitting device.

Aspects of one or more embodiments of the present disclosure are directed toward a display apparatus, an electronic device including the same, and a method of manufacturing the display apparatus, which may minimize or reduce display quality degradation by minimizing or reducing degradation of a light-emitting device. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus including a first display area, a second display area including a transmissive area, and a peripheral area outside the first display area and the second display area includes a substrate, a first pixel circuit on the substrate and in the first display area, and an organic insulating layer on the first pixel circuit and covering the first display area and the second display area. A thickness of the organic insulating layer in the second display area is less than a thickness of the organic insulating layer in the first display area.

The organic insulating layer may include a first organic layer and a second organic layer on the first organic layer. A thickness of the second organic layer in the second display area is less than a thickness of the second organic layer in the first display area.

The organic insulating layer may further include a third organic layer on the second organic layer. A thickness of the third organic layer in the second display area is less than a thickness of the third organic layer in the first display area.

The display apparatus may further include a first pixel electrode in the first display area, on the organic insulating layer, and electrically connected to the first pixel circuit, and a second pixel electrode in the second display area and on the organic insulating layer. A distance between a contact metal on the first organic layer in the first display area and the first pixel electrode is greater than a distance between a connection wiring on the first organic layer in the second display area and the second pixel electrode.

The display apparatus may further include a first pixel electrode in the first display area, on the organic insulating layer, and electrically connected to the first pixel circuit, and a second pixel electrode in the second display area and on the organic insulating layer. An area of the second pixel electrode is greater than an area of the first pixel electrode in a plane.

The display apparatus may further include a pixel-defining film on the first pixel electrode and the second pixel electrode, the pixel-defining film including a first opening and a second opening through which a portion of the first pixel electrode and a portion of the second pixel electrode are respectively exposed. An area of the second opening is greater than an area of the first opening in a plane.

The pixel-defining film may include a light-blocking material.

A distance between the substrate and the second pixel electrode may be less than a distance between the substrate and the first pixel electrode.

The display apparatus may further include a second pixel circuit on the substrate, in the peripheral area, and electrically connected to the second pixel electrode.

The display apparatus may further include an intermediate area between the first display area and the second display area, and may further include a second pixel circuit on the substrate, in the intermediate area, and electrically connected to the second pixel electrode.

The first pixel circuit may include a first thin-film transistor including a first semiconductor layer and a first gate electrode at least partially overlapping the first semiconductor layer, and a second thin-film transistor including a second semiconductor layer including a material different from a material of the first semiconductor layer and a second gate electrode at least partially overlapping the second semiconductor layer.

The first semiconductor layer of the first thin-film transistor may include a silicon semiconductor material. The second semiconductor layer of the second thin-film transistor may include an oxide semiconductor material.

According to one or more embodiments, an electronic device includes a display apparatus including a first display area, a second display area including a transmissive area, and a peripheral area outside the first display area and the second display area, and an electronic component corresponding to the second display area. The display apparatus includes a substrate, a first pixel circuit on the substrate and in the first display area, and an organic insulating layer on the first pixel circuit and covering the first display area and the second display area. A thickness of the organic insulating layer in the second display area is less than a thickness of the organic insulating layer in the first display area.

The organic insulating layer of the display apparatus may include a first organic layer and a second organic layer on the first organic layer. A thickness of the second organic layer in the second display area is less than a thickness of the second organic layer in the first display area.

The organic insulating layer of the display apparatus may further include a third organic layer on the second organic layer. A thickness of the third organic layer in the second display area is less than a thickness of the third organic layer in the first display area.

The display apparatus may further include a first pixel electrode in the first display area, on the organic insulating layer, and electrically connected to the first pixel circuit, and a second pixel electrode in the second display area, and on the organic insulating layer. An area of the second pixel electrode is greater than an area of the first pixel electrode in a plane.

The display apparatus may further include a pixel-defining film on the first pixel electrode and the second pixel electrode, the pixel-defining film including a first opening and a second opening through which a portion of the first pixel electrode and a portion of the second pixel electrode are respectively exposed. An area of the second opening is greater than an area of the first opening in a plane.

A distance between the substrate and the second pixel electrode may be less than a distance between the substrate and the first pixel electrode.

According to one or more embodiments, a method of manufacturing a display apparatus includes preparing a substrate including a first area and a second area adjacent to the first area, forming a first pixel circuit in the first area of the substrate, forming an organic insulating layer on the first pixel circuit and covering the first area and the second area of the substrate, and forming a first pixel electrode on the organic insulating layer and in the first area, and a second pixel electrode on the organic insulating layer and in the second area. The forming the organic insulating layer includes forming the organic insulating layer using a halftone mask so that a thickness of the organic insulating layer in the second area is less than a thickness of the organic insulating layer in the first area.

The forming the organic insulating layer may include forming a first organic layer, and forming a second organic layer on the first organic layer using a halftone mask so that a thickness of the second organic layer in the second area is less than a thickness of the second organic layer in the first area.

The forming the organic insulating layer may further include forming a third organic layer on the second organic layer using a halftone mask so that a thickness of the third organic layer in the second area is less than a thickness of the third organic layer in the first area.

An area of the second pixel electrode may be greater than an area of the first pixel electrode in a plane.

The method may further include a pixel-defining film on the first pixel electrode and the second pixel electrode, the pixel-defining film including a first opening and a second opening through which a portion of the first pixel electrode and a portion of the second pixel electrode are respectively exposed. An area of the second opening is greater than an area of the first opening in a plane.

Other aspects, features, and advantages of the disclosure will become more apparent from the detailed description, the claims, and the drawings.

These general and specific embodiments may be implemented by using a system, a method, a computer program, or a combination thereof.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
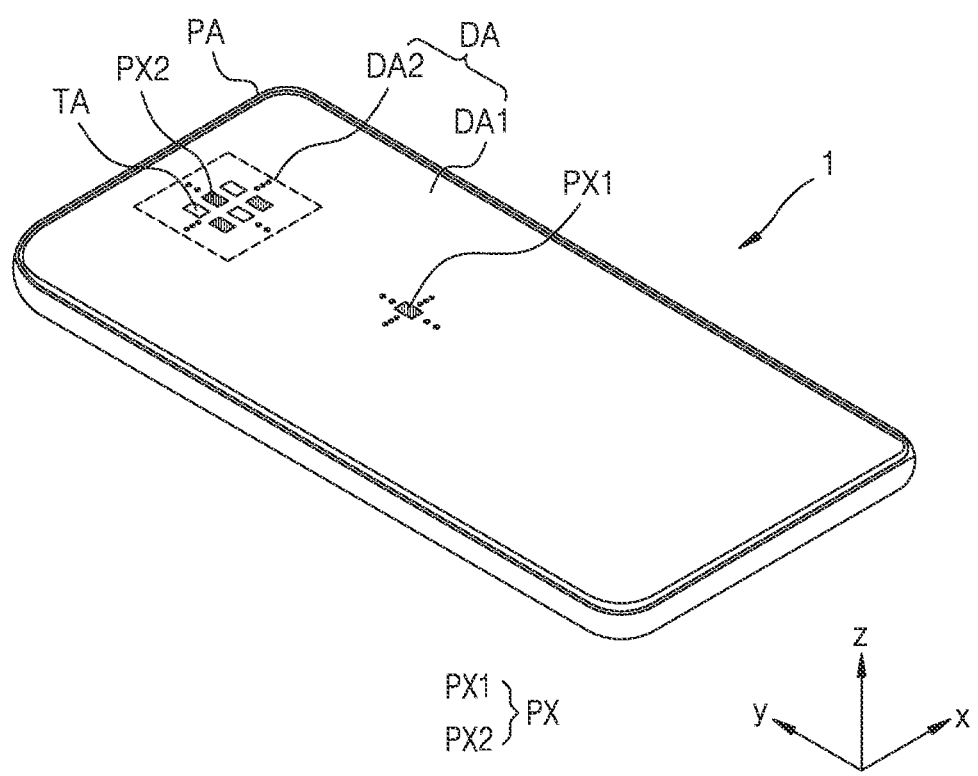
FIG. 1 is a perspective view illustrating an electronic device, according to an embodiment.

Reference will now be made in more detail to embodiments, examples of which are illustrated in the accompanying drawings. Like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in more detail with reference to the drawings. However, the disclosure is not limited to the following embodiments and may be embodied in various forms.

Hereinafter, embodiments will be described in more detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating an electronic device, according to an embodiment.

Referring to FIG. 1, an electronic device 1 may include a display area DA, and a peripheral area PA located outside the display area DA. The display area DA may include a first display area DA1 and a second display area DA2 adjacent to the first display area DA1. The first display area DA1 may be around (e.g., surround) at least a part of the second display area DA2.

The electronic device 1 may provide an image through an array of pixels PX that are two-dimensionally arranged (e.g., arranged along a first direction and a second direction crossing the first direction) in the display area DA. For example, the electronic device 1 may provide a first image by using light emitted from a plurality of first pixels PX1 located in the first display area DA1, and may provide a second image by using light emitted from a plurality of second pixels PX2 located in the second display area DA2. In some embodiments, each of the first image and the second image may be a portion of one image provided through the display area DA of the electronic device 1. Alternatively, in some embodiments, the first image and the second image may be provided as independent images.

For example, in FIG. 1, one second display area DA2 is located in the first display area DA1. In another embodiment, the electronic device 1 may include two or more second display areas DA2, and shapes and sizes of the plurality of second display areas DA2 may be different from one another. When viewed in a plan view or a direction substantially perpendicular to a top surface of the electronic device 1, the second display area DA2 may have any of various suitable shapes such as a polygonal shape (e.g., a quadrangular shape), a circular shape, an elliptical shape, a star shape, or a diamond shape. In an embodiment, a ratio of the second display area DA2 with respect to the display area DA may be less than a ratio of the first display area DA1 with respect to the display area DA. For example, the second display area DA2 may be smaller in area than the first display area DA1.

Although the second display area DA2 is located at the center of an upper portion (e.g., in the +y direction) of the first display area DA1 having a substantially quadrangular shape when viewed in the direction substantially perpendicular to the top surface of the electronic device 1 in FIG. 1, the second display area DA2 may be located at an upper right portion or an upper left portion of the first display area DA1 having the quadrangular shape. Also, for example, the second display area DA2 may be located inside the first display area DA1 as shown in FIG. 1, and may be entirely surrounded by the first display area DA1. In another example, the second display area DA2 may be located on or at a side of the first display area DA1, and may be partially surrounded by the first display area DA1. For example, the second display area DA2 may be located at a corner of the first display area DA1, and may be partially surrounded by the first display area DA1.

An electronic component 20 (e.g., see FIG. 3) may be located in the second display area DA2. The electronic component 20 may be located below a display apparatus 10 (e.g., see FIG. 3) to correspond to the second display area DA2. In some embodiments, the second display area DA2 may include a transmissive area TA through which light and/or sound output from the electronic component 20 to the outside or traveling from the outside toward the electronic component 20 may be transmitted.

The transmissive area TA through which light may be transmitted may be an area where the pixels PX are not located. In the case of the electronic device 1 according to an embodiment, when light is transmitted through the second display area DA2 including the transmissive area TA, a light transmittance may be equal to or greater than about 10%, and more preferably, equal to or greater than about 25%, about 40%, about 50%, about 85%, or about 90%.

Because the second display area DA2 includes the transmissive area TA, an array of the plurality of first pixels PX1 arranged in the first display area DA1 and an array of the plurality of second pixels PX2 arranged in the second display area DA2 may be different from each other. For example, the transmissive area TA may be located between adjacent second pixels PX2 from among the plurality of second pixels PX2. In this case, a resolution of the second display area DA2 may be lower than that of the first display area DA1. That is, because the second display area DA2 includes the transmissive area TA, the number of the second pixels PX2 that may be arranged per unit area in the second display area DA2 may be less than the number of the first pixels PX1 that are arranged per unit area in the first display area DA1. For example, a resolution of the second display area DA2 may be about ½, about ⅜, about ⅓, about ¼, about ⅔, about ⅛, about ⅑, or about 1/16 of a resolution of the first display area DA1. For example, a resolution of the first display area DA1 may be about 400 ppi or more, and a resolution of the second display area DA2 may be about 200 ppi or about 100 ppi.

The peripheral area PA where an image is not provided may entirely or partially surround the display area DA. For example, the peripheral area PA may entirely or partially surround the first display area DA1 and/or the second display area DA2. A driver or the like for providing an electrical signal or power to the display area DA may be located in the peripheral area PA. A pad to which an electronic element or a printed circuit board may be connected (e.g., electrically connected) may be located in the peripheral area PA.

Although the electronic device 1 is described and depicted as a smartphone for convenience of explanation, the electronic device 1 is not limited thereto. The electronic device 1 may be applied to any of various products such as a television, a laptop computer, a monitor, an advertisement board, or an Internet of things (IoT) product as well as a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). Also, the electronic device 1 according to an embodiment may be applied to a wearable device such as a smart watch, a watch phone, a glasses-type display, or a head-mounted display (HMD). Also, the electronic device 1 according to an embodiment may be applied to a center information display (CID) located on an instrument panel, a center fascia, or a dashboard of a vehicle, a room mirror display replacing a side-view mirror of a vehicle, or a display screen located on the back of a front seat for entertainment for a back seat of a vehicle.

Also, although the electronic device 1 includes an organic light-emitting diode (OLED) as a light-emitting device, the electronic device 1 of the present disclosure is not limited thereto. In another embodiment, the electronic device 1 may be a light-emitting display apparatus including an inorganic light-emitting diode, that is, an inorganic light-emitting display apparatus. In another embodiment, the electronic device 1 may be a quantum dot light-emitting display apparatus.

Figure 2:
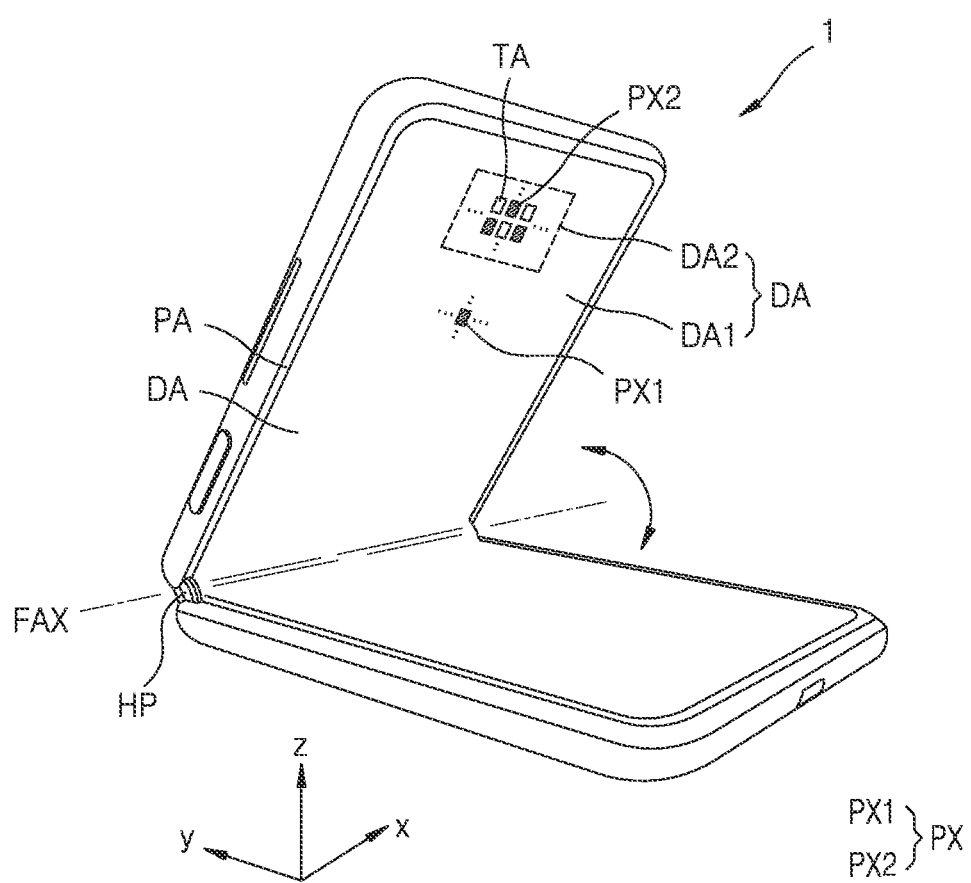
FIG. 2 is a perspective view illustrating an electronic device, according to another embodiment.

FIG. 2 is a perspective view illustrating an electronic device, according to another embodiment. The same or substantially the same elements as those described with reference to FIG. 1 may not be described, and the following will focus on differences.

Referring to FIG. 2, the electronic device 1 may be a foldable device. For example, the electronic device 1 may include a hinge portion HP, and may be folded about a folding axis FAX crossing the display area DA by the hinge portion HP. For example, the electronic device 1 may be folded so that a portion of the display area DA faces another portion of the display area DA as shown in FIG. 2 (i.e., an in-folding method). In another example, the electronic device 1 may be folded so that a portion of the display area DA faces away from another portion of the display area DA (i.e., an out-folding method). In other words, when folded according to the out-folding method, a part of the display area DA and another part of the display area DA may face opposite directions from each other.

Although the folding axis FAX extends in an x direction in FIG. 2, in another embodiment, the folding axis FAX may extend in a y direction. In another embodiment, the folding axis FAX may extend in a direction intersecting the x direction and the y direction in an xy plane (i.e., a plane defined by the x direction and the y direction). Also, although one folding axis FAX is illustrated in FIG. 2, in another embodiment, the electronic device 1 may be folded multiple times about a plurality of folding axes FAX crossing the display area DA.

Figure 3:
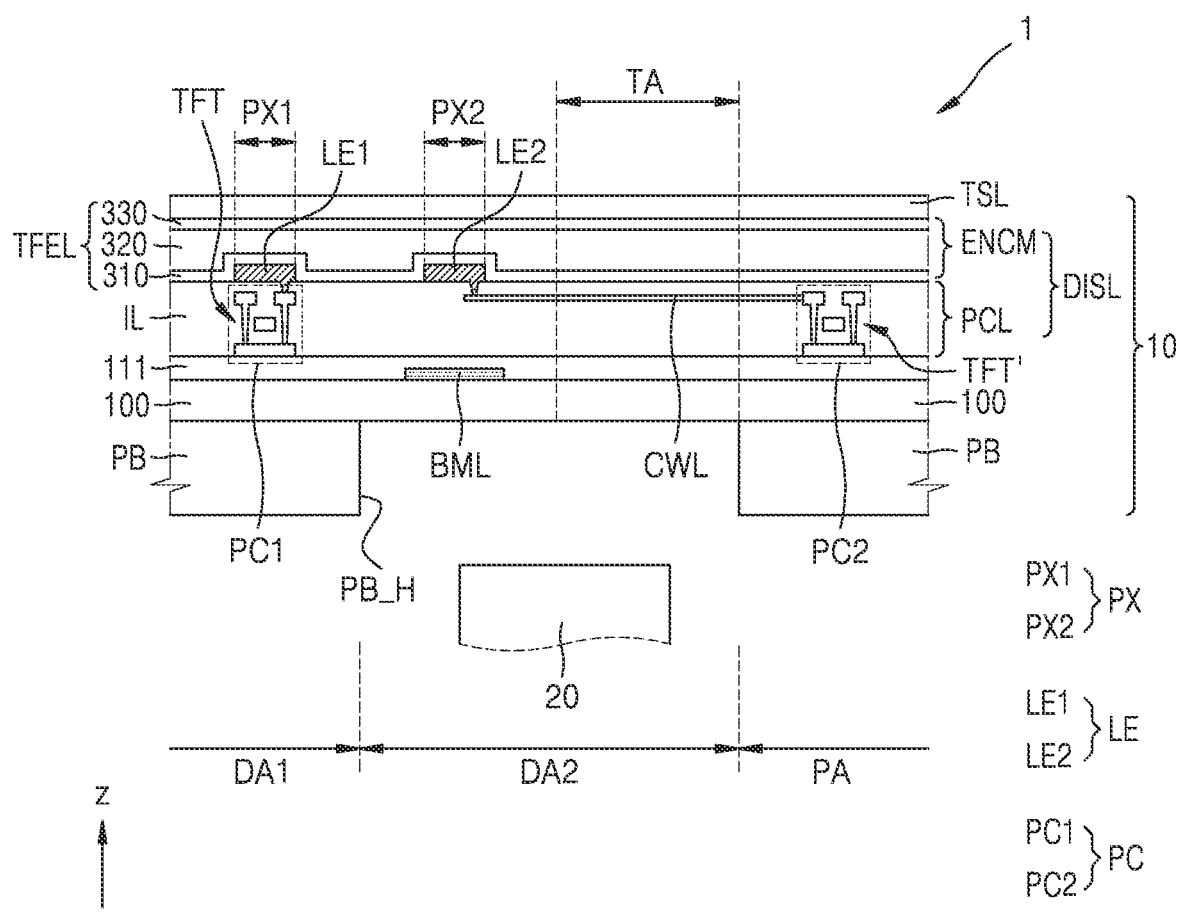
FIG. 3 is a cross-sectional view illustrating a part of an electronic device, according to an embodiment.

FIG. 3 is a cross-sectional view illustrating a part of an electronic device, according to an embodiment.

Referring to FIG. 3, the electronic device 1 may include the display apparatus 10 and the electronic component 20 overlapping the display apparatus 10. A cover window that protects the display apparatus 10 may be further located on the display apparatus 10.

The display apparatus 10 may include the first display area DA1 that provides a first image, and the second display area DA2 that provides a second image and overlaps the electronic component 20. The display apparatus 10 may include a substrate 100, a display layer DISL and a touch-screen layer TSL over the substrate 100, and a panel protection member PB located under the substrate 100.

The display layer DISL may include a pixel circuit layer PCL including a pixel circuit PC, a light-emitting device layer including a light-emitting device LE, and a sealing member ENCM. For example, the sealing member ENCM may be a thin-film encapsulation layer TFEL. A buffer layer 111 may be located between the substrate 100 and the display layer DISL, and an insulating layer IL may be located in the display layer DISL. In some embodiments, the insulating layer IL may be located on the buffer layer 111.

The substrate 100 may be formed of an insulating material such as glass, quartz, or a polymer resin. The substrate 100 may be a rigid substrate, or a flexible substrate that is bendable, foldable, or rollable.

In the first display area DA1 of the display apparatus 10, a plurality of first pixel circuits PC1 and a plurality of first light-emitting devices LE1 respectively connected (e.g., electrically connected) to the plurality of first pixel circuits PC1 may be located. The first pixel circuit PC1 may include at least one thin-film transistor TFT, and may control light emission of the first light-emitting device LE1. The first light-emitting device LE1 may emit light through an emission area, and the emission area may be defined as the first pixel PX1. That is, the first pixel PX1 may be implemented by light emission of the first light-emitting device LE1.

A plurality of second light-emitting devices LE2 may be located in the second display area DA2 of the display apparatus 10. In some embodiments, the second pixel circuit PC2 that controls light emission of the second light-emitting device LE2 may not be located in the second display area DA2, but may be located in the peripheral area PA. In another embodiment, the second pixel circuit PC2 may be located in a part of the first display area DA1, or may be located between the first display area DA1 and the second display area DA2.

The second pixel circuit PC2 may include at least one thin-film transistor TFT', and may be connected (e.g., electrically connected) to the second light-emitting device LE2 by a connection wiring CWL. For example, the connection wiring CWL may be formed of a transparent conductive material. The second pixel circuit PC2 may control light emission of the second light-emitting device LE2. The second light-emitting device LE2 may emit light through an emission area, and the emission area may be defined as the second pixel PX2. That is, the second pixel PX2 may be implemented by light emission of the second light-emitting device LE2

Also, in the second display area DA2, a portion where the second light-emitting device LE2 is not located may include the transmissive area TA. The transmissive area TA may be an area through which light and/or a signal emitted from the electronic component 20 (e.g., the electronic component 20 located to correspond to the second display area DA2) or light and/or a signal incident on the electronic component 20 is transmitted.

The connection wiring CWL that connects (e.g., electrically connects) the second pixel circuit PC2 to the second light-emitting device LE2 may be located in the transmissive area TA. Because the connection wiring CWL may be formed of a transparent conductive material having a high transmittance, although the connection wiring CWL is located in the transmissive area TA, a decrease in a light transmittance of the transmissive area TA may be prevented or reduced.

Also, in an embodiment, because the second pixel circuit PC2 is not located in the second display area DA2, the area of the transmissive area TA may be sufficiently secured and a light transmittance of the second display area DA2 may be increased.

The light-emitting device LE may be covered by the thin-film encapsulation layer TFEL. In some embodiments, the thin-film encapsulation layer TFEL may include at least one inorganic encapsulation layer and at least one organic encapsulation layer as shown in FIG. 3. In an embodiment, the thin-film encapsulation layer TFEL may include a first inorganic encapsulation layer 310, a second inorganic encapsulation layer 330, and an organic encapsulation layer 320 between the first inorganic encapsulation layer 310 and the second inorganic encapsulation layer 330.

The touchscreen layer TSL may obtain coordinate information according to an external input, for example, a touch event. The touchscreen layer TSL may include a touch electrode and touch wirings connected to the touch electrode. The touchscreen layer TSL may detect an external input by using a self-capacitive method or a mutual capacitive method.

The touchscreen layer TSL may be formed on the thin-film encapsulation layer TFEL. Alternatively, the touchscreen layer TSL may be separately formed on a touch substrate, and then may be coupled to the thin-film encapsulation layer TFEL through an adhesive layer such as an optically clear adhesive (OCA). In an embodiment, the touchscreen layer TSL may be formed directly on the thin-film encapsulation layer TFEL, and in this case, the adhesive layer may not be located between the touchscreen layer TSL and the thin-film encapsulation layer TFEL.

The panel protection member PB may be attached to the bottom of the substrate 100, and may support and protect the substrate 100. The panel protection member PB may have a hole PB_H corresponding to the second display area DA2. Because the panel protection member PB has the hole PB_H, a light transmittance of the second display area DA2 may be increased. The panel protection member PB may include polyethylene terephthalate (PET) or polyimide (PI).

The second display area DA2 may be larger than an area where the electronic component 20 is located. In some embodiments, the area of the hole PB_H of the panel protection member PB may not be the same as the area of the second display area DA2.

The electronic component 20 may be located in the second display area DA2. The electronic component 20 may be an electronic element using light or sound. For example, the electronic element may be a sensor that measures a distance such as a proximity sensor, a sensor that recognizes a user's body part (e.g., fingerprint, iris, or face), a small lamp that outputs light, or an image sensor (e.g., a camera) that captures an image. The electronic element using light may use light of any of various suitable wavelength bands such as visible light, infrared light, or ultraviolet light. The electronic element using sound may use ultrasound or sound of another frequency band. In some embodiments, a plurality of electronic components 20 may be located in the second display area DA2. In this case, the plurality of electronic components 20 may have different functions from each other. However, the present disclosure is not limited thereto.

In some embodiments, a bottom metal layer BML may be located in the second display area DA2. The bottom metal layer BML may be located between the substrate 100 and the second light-emitting device LE2. The bottom metal layer BML may overlap (e.g., overlap in the thickness direction of the substrate 100) the second light-emitting device LE2. The bottom metal layer BML may include a light-blocking material, and may prevent or substantially prevent external light from reaching the second light-emitting device LE2.

Figure 4:
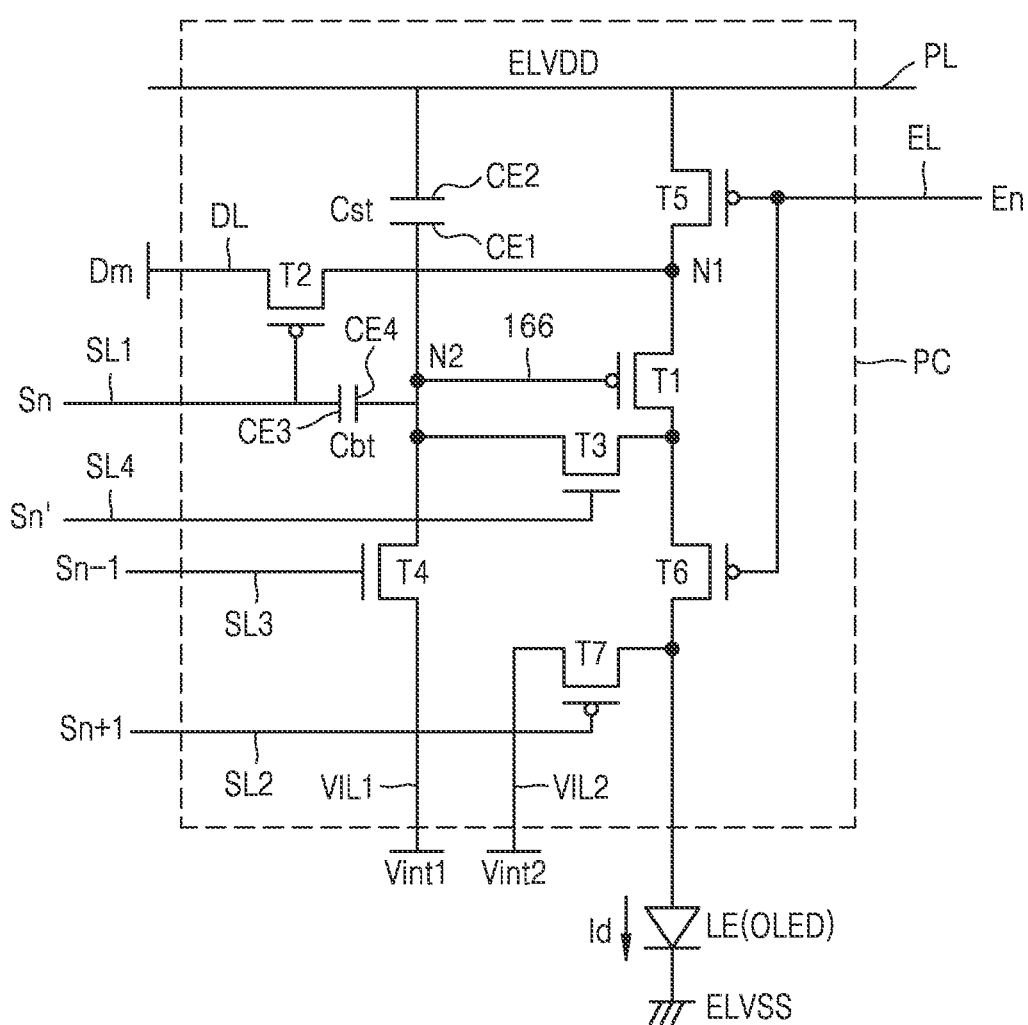
FIG. 4 is an equivalent circuit diagram of a pixel circuit included in an electronic device, according to an embodiment.

FIG. 4 is an equivalent circuit diagram of a pixel circuit included in an electronic device, according to an embodiment.

Referring to FIG. 4, the pixel circuit PC may include first through seventh thin-film transistors T1, T2, T3, T4, T5, T6, and T7, a first capacitor Cst, and a second capacitor Cbt.

Also, the pixel circuit PC may be connected to a plurality of signal lines, first and second initialization voltage lines VIL1 and VIL2, and a power supply voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2, and/or a power supply voltage line PL may be shared by neighboring pixel circuits.

The power supply voltage line PL may transmit a driving power supply voltage ELVDD to the first thin-film transistor T1. The first initialization voltage line VIL1 may transmit a first initialization voltage Vint1 for initializing the first thin-film transistor T1 to the pixel circuit PC. The second initialization voltage line VIL2 may transmit a second initialization voltage Vint2 for initializing the light-emitting device LE to the pixel circuit PC.

For example, the third thin-film transistor T3 and the fourth thin-film transistor T4 from among the first through seventh thin-film transistors T1 through T7 may be implemented as NMOSs and the rest of the first through seventh thin-film transistors T1 through T7 may be implemented as PMOSs. However, the present disclosure is not limited thereto.

The first thin-film transistor T1 may be connected to the power supply voltage line PL via the fifth thin-film transistor T5, and may be connected (e.g., electrically connected) to the light-emitting device LE via the sixth thin-film transistor T6. The first thin-film transistor T1 may function as a driving thin-film transistor, and may receive a data signal Dm and may supply a driving current Id to the light-emitting device LE according to a switching operation of the second thin-film transistor T2.

The second thin-film transistor T2 that is a switching thin-film transistor may be connected to the first scan line SL1 and the data line DL, and may be connected to the power supply voltage line PL via the fifth thin-film transistor T5. The second thin-film transistor T2 may be turned on according to a first scan signal Sn received through the first scan line SL1, and may perform a switching operation of transmitting the data signal Dm transmitted through the data line DL to a first node N1.

The third thin-film transistor T3 that is a compensation thin-film transistor may be connected to the fourth scan line SL4, and may be connected to the light-emitting device LE via the sixth thin-film transistor T6. The third thin-film transistor T3 may be turned on according to a fourth scan signal Sn' received through the fourth scan line SL4, and may diode-connect the first thin-film transistor T1.

The fourth thin-film transistor T4 that is a first initialization thin-film transistor may be connected to the third scan line SL3 that is a previous scan line and the first initialization voltage line VIL1, and may be turned on according to a third scan signal Sn−1 that is a previous scan signal received through the third scan line SL3 and may initialize a voltage of a gate electrode of the first thin-film transistor T1 by transmitting the first initialization voltage Vint1 from the first initialization voltage line VIL1 to the gate electrode of the first thin-film transistor T1.

The fifth thin-film transistor T5 may be an operation control thin-film transistor, and the sixth thin-film transistor T6 may be an emission control thin-film transistor. The fifth thin-film transistor T5 and the sixth thin-film transistor T6 are connected to the emission control line EL, and are concurrently (e.g., simultaneously) turned on according to an emission control signal En received through the emission control line EL and form a current path so that the driving current Id flows from the power supply voltage line PL to the light-emitting device LE.

The seventh thin-film transistor T7 that is a second initialization thin-film transistor may be connected to the second scan line SL2 that is a next scan line and the second initialization voltage line VIL2, and may be turned on according to a second scan signal Sn+1 that is a next scan signal received through the second scan line SL2 and may initialize the light-emitting device LE by transmitting the second initialization voltage Vint2 from the second initialization voltage line VIL2 to the light-emitting device LE. In some embodiments, the seventh thin-film transistor T7 may be omitted.

The first capacitor Cst may include a first electrode CE1 and a second electrode CE2. The first electrode CE1 may be connected to the gate electrode of the first thin-film transistor T1, and the second electrode CE2 may be connected to the power supply voltage line PL. The first capacitor Cst may maintain a voltage applied to the gate electrode of the first thin-film transistor T1 by storing and maintaining a voltage corresponding to a difference between voltages of both ends of the gate electrode of the first thin-film transistor T1 and the power supply voltage line PL.

The second capacitor Cbt may include a third electrode CE3 and a fourth electrode CE4. The third electrode CE3 may be connected to the first scan line SL1 and a gate electrode of the second thin-film transistor T2. The fourth electrode CE4 may be connected to the gate electrode of the first thin-film transistor T1 and the first electrode CE1 of the first capacitor Cst. The second capacitor Cbt is a boosting capacitor, and when the first scan signal Sn of the first scan line SL1 is a voltage for turning off the second thin-film transistor T2, the second capacitor Cbt may reduce a voltage displaying black (i.e., black voltage) by increasing a voltage of a second node N2.

The light-emitting device LE that is an organic light-emitting diode OLED may include a pixel electrode and a counter electrode, and the counter electrode may receive a common power supply voltage ELVSS. The light-emitting device LE displays an image by receiving the driving current Id from the first thin-film transistor T1 and emitting light.

A detailed operation of each pixel circuit PC according to an embodiment is as follows.

During a first initialization period, when the third scan signal Sn−1 is applied through the third scan line SL3, the fourth thin-film transistor T4 may be turned on in response to the third scan signal Sn−1, and the first thin-film transistor T1 may be initialized by the first initialization voltage Vint1 supplied from the first initialization voltage line VIL1.

During a data programming period, when the first scan signal Sn and the fourth scan signal Sn' are respectively applied through the first scan line SL1 and the fourth scan line SL4, the second thin-film transistor T2 and the third thin-film transistor T3 may be turned on in response to the first scan signal Sn and the fourth scan signal Sn'. In this case, the first thin-film transistor T1 may be diode-connected by the third thin-film transistor T3 that is turned on, and may be forward biased. Next, a compensation voltage obtained by subtracting a threshold voltage Vth of the first thin-film transistor T1 from the data signal Dm applied from the data line DL may be applied to the gate electrode of the first thin-film transistor T1. The driving power supply voltage ELVDD and the compensation voltage may be applied to both ends of the first capacitor Cst, and a charge corresponding to a voltage difference between both ends is stored in the first capacitor Cst.

During an emission period, the fifth thin-film transistor T5 and the sixth thin-film transistor T6 may be turned on by the emission control signal En applied from the emission control line EL. The driving current Id may be generated according to a voltage difference between a voltage of the gate electrode of the first thin-film transistor T1 and the driving power supply voltage ELVDD, and may be supplied through the sixth thin-film transistor T6 to the light-emitting device LE.

During a second initialization period, when the second scan signal Sn+1 is applied through the second scan line SL2, the seventh thin-film transistor T7 is turned on in response to the second scan signal Sn+1, and the light-emitting device LE is initialized by the second initialization voltage Vint2 supplied from the second initialization voltage line VIL2.

In an embodiment, a plurality of thin-film transistors (e.g., T1 through T7) may include a silicon-based thin-film transistor including a silicon semiconductor. In another embodiment, at least one of the plurality of thin-film transistors (e.g., T1 through T7) may include an oxide-based thin-film transistor including an oxide semiconductor, and the rest of the plurality of thin-film transistors may include a silicon-based thin-film transistor including a silicon semiconductor.

In more detail, the first thin-film transistor T1 that directly affects the brightness of the display apparatus 10 (e.g., see FIG. 3) may be a silicon-based thin-film transistor including a silicon semiconductor formed of polycrystalline silicon having high reliability, thereby implementing the display apparatus having a high resolution.

Because an oxide semiconductor has high carrier mobility and a small leakage current, voltage drop may not be large even when a driving time is long. That is, because a color change in an image due to voltage drop is not large even during low frequency driving, low frequency driving may be performed. As such, because an oxide semiconductor may have a small leakage current, when at least one of the third thin-film transistor T3 and the fourth thin-film transistor T4 connected to the gate electrode of the first thin-film transistor T1 includes an oxide semiconductor, a leakage current that may flow to the gate electrode of the first thin-film transistor T1 may be prevented or reduced and power consumption may be reduced.

For convenience of explanation, the following will be described assuming that the first, second, fifth, sixth, and seventh thin-film transistors T1, T2, T5, T6, and T7 are silicon-based thin-film transistors including a silicon semiconductor, and the third and fourth thin-film transistors T3 and T4 are oxide-based thin-film transistors including an oxide semiconductor.

FIGS. 5A through 5G are plan views illustrating a part of a display apparatus provided in an electronic device, according to embodiments.

Figure 5A:
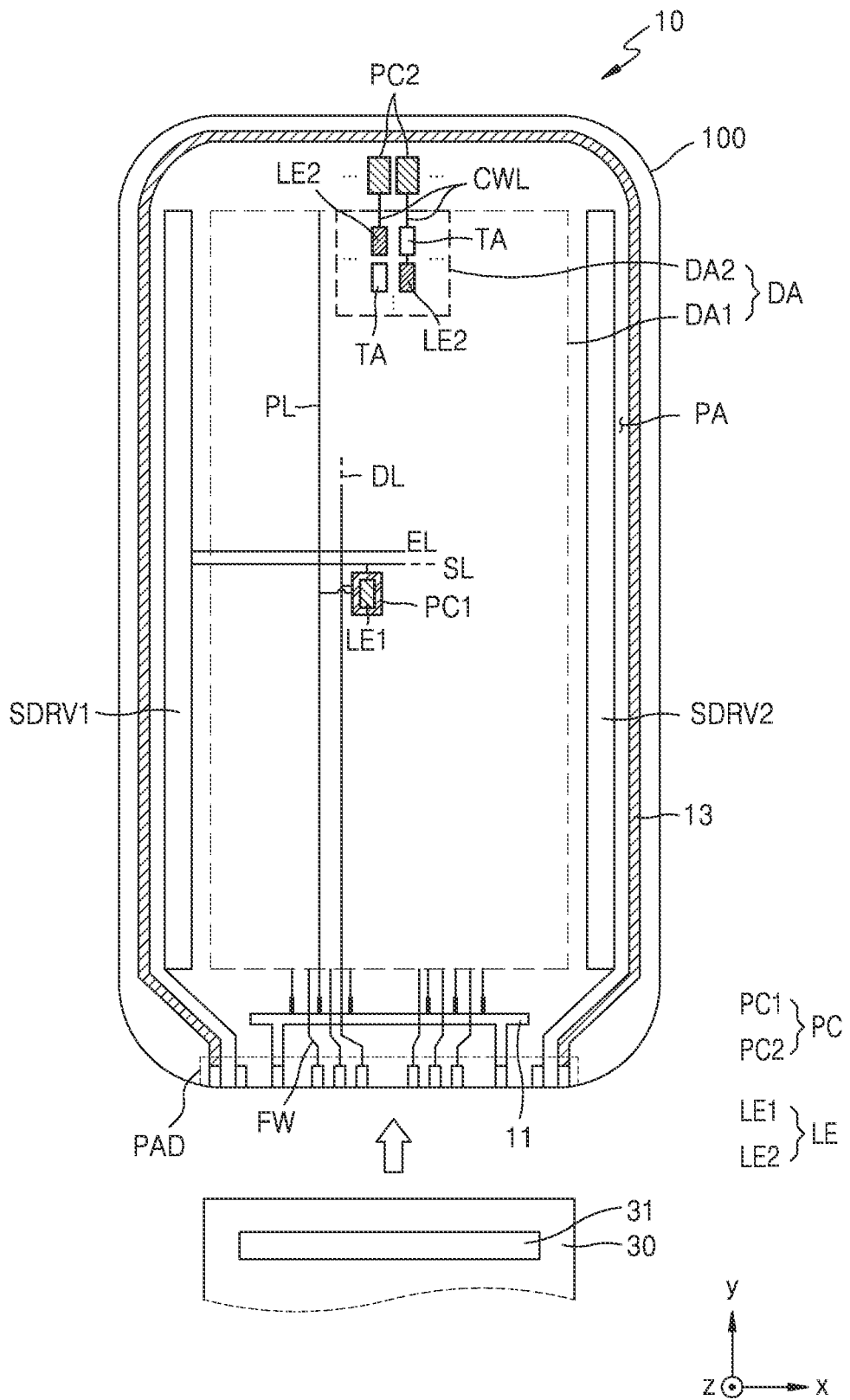
FIGS. 5A through 5G are plan views illustrating a part of a display apparatus provided in an electronic device, according to embodiments.

Referring to FIG. 5A, various elements of the display apparatus 10 may be located on the substrate 100. The display apparatus 10 may include the display area DA and the peripheral area PA located outside the display area DA. The display area DA may include the first display area DA1, and the second display area DA2 including the transmissive area TA.

The first light-emitting device LE1 such as an organic light-emitting diode OLED may be located in the first display area DA1. The first light-emitting device LE1 may emit light of a certain color through the first pixel PX1 (e.g., see FIG. 1). That is, the first pixel PX1 may be implemented by the first light-emitting device LE1, and the first pixel PX1 may be a sub-pixel. The first light-emitting device LE1 may emit, for example, red light, green light, blue light, or white light. The first pixel circuit PC1 that drives the first light-emitting device LE1 may be located in the first display area DA1, and may be connected (e.g., electrically connected) to the first light-emitting device LE1. For example, the first pixel circuit PC1 may overlap the first light-emitting device LE1.

The second display area DA2 may be located on or at a side of the display area DA and may be partially surrounded by the first display area DA1 as shown in FIG. 5A. The second light-emitting device LE2 such as an organic light-emitting diode OLED may be located in the second display area DA2. The second light-emitting device LE2 may emit light of a certain color through the second pixel PX2 (e.g., see FIG. 1). That is, the second pixel PX2 may be implemented by the second light-emitting device LE2, and the second pixel PX2 may be a sub-pixel. The second light-emitting device LE2 may emit, for example, red light, green light, blue light, or white light.

The second pixel circuit PC2 that drives the second light-emitting device LE2 may be located in the peripheral area PA, and may be connected (e.g., electrically connected) to the second light-emitting device LE2. For example, the second pixel circuit PC2 may be located in the peripheral area PA adjacent to the second display area DA2. That is, the second pixel circuit PC2 may be located adjacent to an outer side of the second display area DA2. When the second display area DA2 is located in an upper portion of the display area DA as shown in FIG. 5A, the second pixel circuit PC2 may be located in an upper portion of the peripheral area PA. The second pixel circuit PC2 and the second light-emitting device LE2 may be connected (e.g., electrically connected) to each other by, for example, the connection wiring CWL that extends in the y direction. For example, the connection wiring CWL may extend in the same direction as a direction in which the data line DL extends. In one or more embodiments, the data line DL may extend in the y direction.

The second display area DA2 may include the transmissive area TA. The transmissive areas TA may surround the second light-emitting devices LE2. Alternatively, the transmissive areas TA may be arranged in a lattice shape with the plurality of second light-emitting devices LE2.

The first pixel circuit PC1 and the second pixel circuit PC2 may be respectively connected (e.g., electrically connected) to outer circuits located in the peripheral area PA. A first scan driving circuit SDRV1, a second scan driving circuit SDRV2, a terminal unit PAD, a driving voltage supply line 11, and a common voltage supply line 13 may be located in the peripheral area PA.

The first scan driving circuit SDRV1 may apply a scan signal to each of the first pixel circuits PC1 that drive the first light-emitting devices LE1 through scan lines SL. The scan lines SL may be the first through fourth scan lines SL1, SL2, SL3, and SL4 of FIG. 4. The first scan driving circuit SDRV1 may apply an emission control signal to each of the first pixel circuits PC1 through the emission control line EL. The second scan driving circuit SDRV2 and the first scan driving circuit SDRV1 may be located opposite to each other with the display area DA (e.g., the first display area DA1 and/or the second display area DA2) therebetween, and may be substantially parallel to each other. Some of the first pixel circuits PC1 of the first display area DA1 may be connected (e.g., electrically connected) to the first scan driving circuit SDRV1, and the rest may be connected (e.g., electrically connected) to the second scan driving circuit SDRV2.

In some embodiments, the second pixel circuits PC2 that drive the second light-emitting device LE2 may also receive a scan signal and an emission control signal from the first scan driving circuit SDRV1 and/or the second scan driving circuit SDRV2, through separate wirings extending from the scan line SL and/or the emission control lines EL.

The terminal unit PAD may be located on a side of the substrate 100. The terminal unit PAD may be exposed without being covered by an insulating layer, and may be connected to a display circuit board 30. A display driver 31 may be located on the display circuit board 30.

The display driver 31 may generate a control signal transmitted to the first scan driving circuit SDRV1 and the second scan driving circuit SDRV2. The display driver 31 may generate a data signal, and the generated data signal may be transmitted to the first pixel circuits PC1 through a fan-out wiring FW and the data line DL connected to the fan-out wiring FW. Also, a data signal may also be transmitted to the second pixel circuits PC2, through the data line DL or separate wirings extending from the data line DL.

The display driver 31 may supply the driving power supply voltage ELVDD to the driving voltage supply line 11, and may supply the common power supply voltage ELVSS to the common voltage supply line 13. The driving power supply voltage ELVDD may be applied to the first pixel circuit PC1 through the power supply voltage line PL connected to the driving voltage supply line 11, and the driving power supply voltage ELVDD may also be applied to the second pixel circuits PC through the driving voltage supply line 11 or separate wirings extending from the driving voltage supply line 11. The common power supply voltage ELVSS may be connected to the common voltage supply line 13, and may be applied to a counter electrode of each of the first light-emitting device LE1 and the second light-emitting device LE2.

The driving voltage supply line 11 may be located below the first display area DA1, and may extend in the x direction. The common voltage supply line 13 may have a loop shape with an open side, and may partially surround the first display area DA1.

Figure 5B:
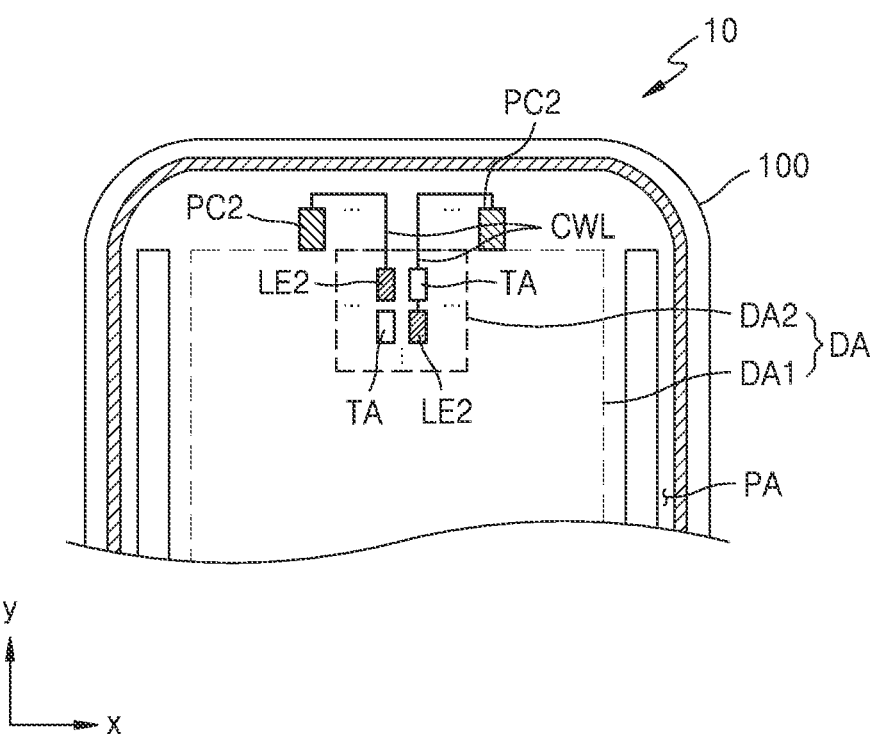

Referring to FIG. 5B, the second pixel circuit PC2 may be located in the peripheral area PA adjacent to the first display area DA1. The second pixel circuit PC2 may be located adjacent to an outer side of the first display area DA1. In this case, for example, the second pixel circuit PC2 and the second light-emitting device LE2 may be connected (e.g., electrically connected) to each other by the connection wiring CWL extending in the x direction and the y direction. For example, the connection wiring CWL may extend in the same direction as a direction in which the scan line SL extends and/or in the same direction as a direction in which the data line DL extends. In one or more embodiments, a portion of the connection wiring CWL extends in the same direction as the scan line SL and another portion of the connection wiring CWL extends in the same direction as the data line DL.

Figure 5C:
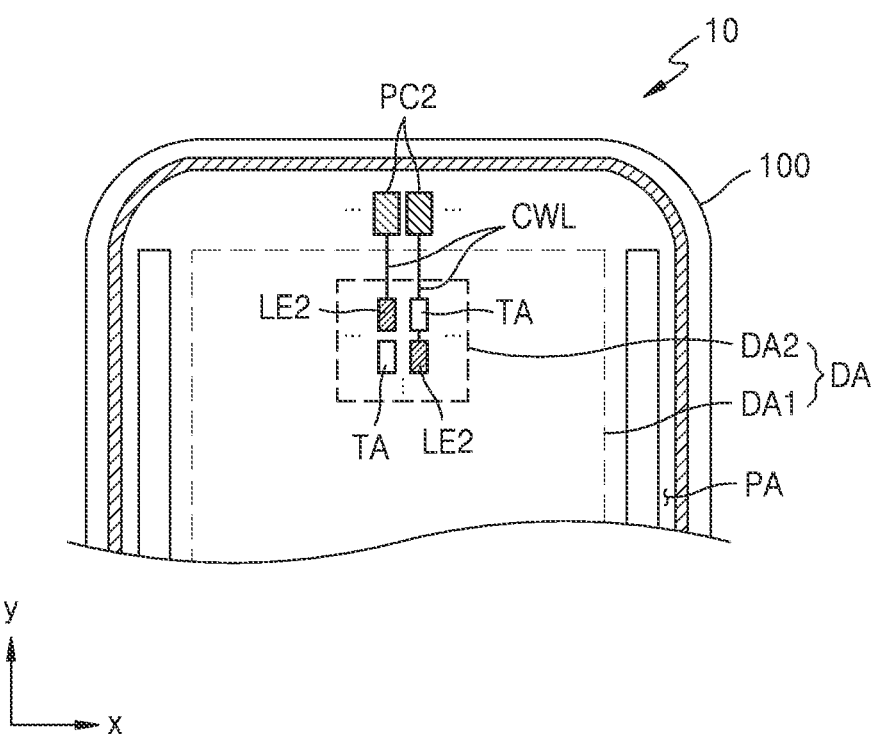

Referring to FIG. 5C, the second display area DA2 may be located inside the first display area DA1 and may be entirely surrounded by the first display area DA1. The second light-emitting device LE2 may be located in the second display area DA2, and the second pixel circuit PC2 that drives the second light-emitting device LE2 may be located in the peripheral area PA located over the second display area DA2. The second pixel circuit PC2 and the second light-emitting device LE2 may be connected (e.g., electrically connected) by the connection wiring CWL. In this case, for example, the connection wiring CWL may extend in the same direction as that of the data line DL.

Figure 5D:
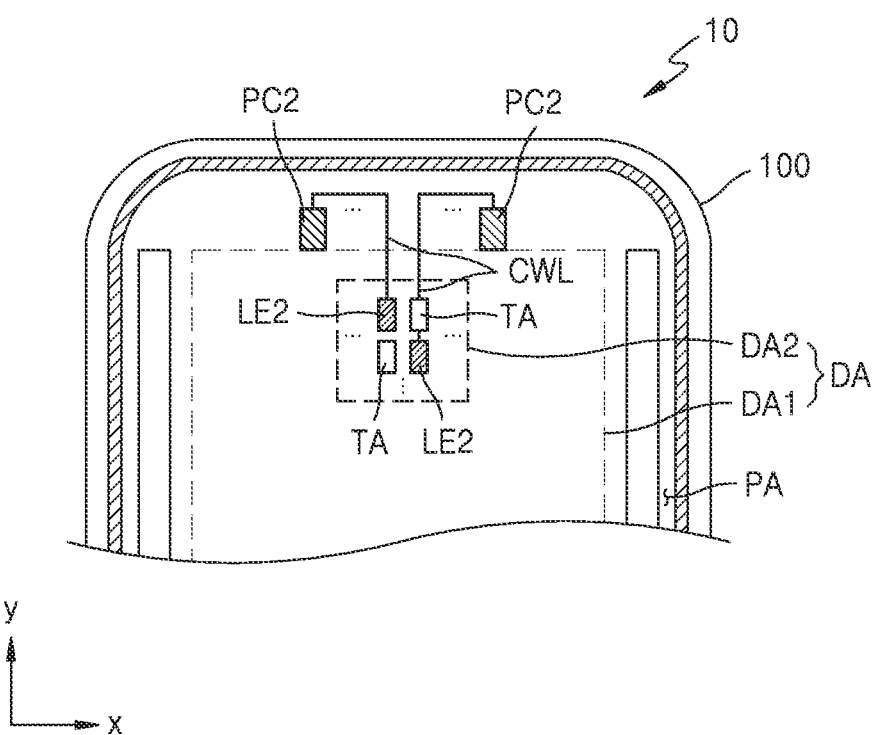

Referring to FIG. 5D, the second light-emitting device LE2 may be located in the second display area DA2 located inside the first display area DA1. For example, the second pixel circuit PC2 that drives the second light-emitting device LE2 may be located in the peripheral area PA located at the upper left and/or the upper right of the second display area DA2. The second pixel circuit PC2 and the second light-emitting device LE2 may be connected (e.g., electrically connected) to each other by the connection wiring CWL, and in this case, for example, the connection wiring CWL may extend in the same direction as a direction in which the scan line SL extends and/or in the same direction as a direction in which the data line DL extends. In one or more embodiments, a portion of the connection wiring CWL extends in the same direction as the scan line SL and another portion of the connection wiring CWL extends in the same direction as the data line DL.

Figure 5E:
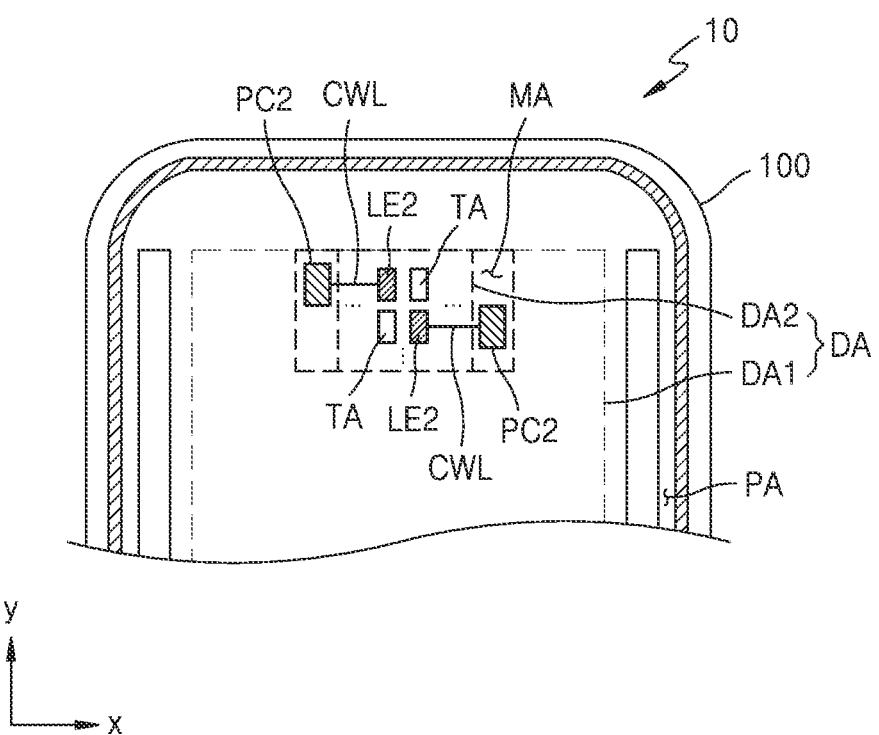

Referring to FIG. 5E, the second display area DA2 may be located on or at a side of the display area DA, and may be partially surrounded by the first display area DA1. In an embodiment, an intermediate area MA (e.g., an intermediate area MA of the display apparatus 10 of the electronic device 1) may be located between the first display area DA1 and the second display area DA2. The intermediate area MA may surround at least a part of the second display area DA2. For example, the intermediate area MA may be located at the left and/or the right of the second display area DA2. Alternatively, the intermediate area MA may be located below the second display area DA2.

The second light-emitting device LE2 may be located in the second display area DA2, and the second pixel circuit PC2 that drives the second light-emitting device LE2 may be located in the intermediate area MA. The second pixel circuit PC2 and the second light-emitting device LE2 may be connected (e.g., electrically connected) to each other by the connection wiring CWL. When the intermediate area MA is located at the left and/or the right of the second display area DA2, for example, the connection wiring CWL may extend in the same direction as that of the scan line SL.

In an embodiment, the number of the second pixel circuits PC2 located in the intermediate area MA per unit area may be equal to or less than the number of the first pixel circuits PC1 located in the first display area DA1 per unit area.

Figure 5F:
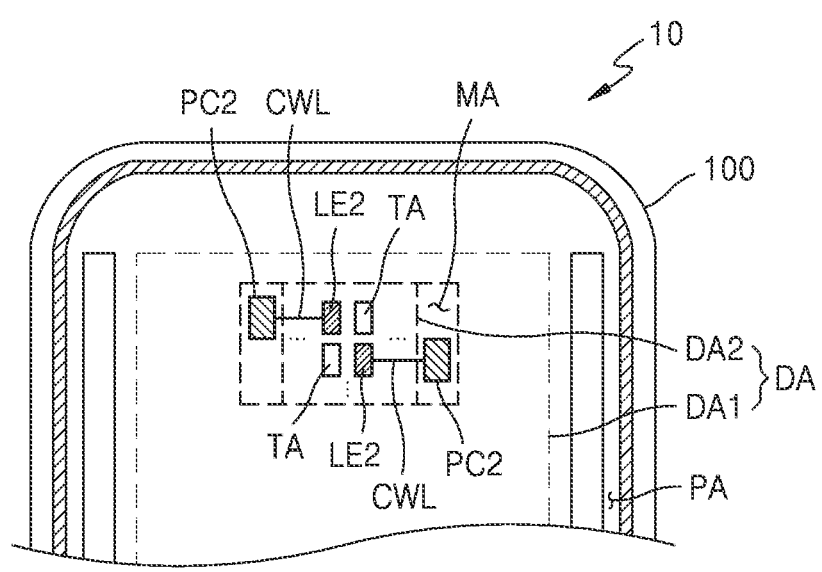

Referring to FIG. 5F, the second display area DA2 may be located inside the first display area DA1 and may be entirely surrounded by the first display area DA1. The intermediate area MA may be located between the first display area DA1 and the second display area DA2. In an embodiment, not only the second display area DA2 but also the intermediate area MA may be entirely surrounded by the first display area DA1.

In an embodiment, the intermediate area MA may entirely or partially surround the second display area DA2. For example, as shown in FIG. 5F, the intermediate area MA may be located at the left and/or the right of the second display area DA2. Alternatively, the intermediate area MA may be located above and/or below the second display area DA2.

The second light-emitting device LE2 may be located in the second display area DA2, and the second pixel circuit PC2 that drives the second light-emitting device LE2 may be located in the intermediate area MA. The second pixel circuit PC2 and the second light-emitting device LE2 may be connected (e.g., electrically connected) to each other by the connection wiring CWL. When the intermediate area MA is located at the left and/or the right of the second display area DA2, for example, the connection wiring CWL may extend in the same direction as a direction in which the scan line SL extends. In some embodiments, when the intermediate area MA is located above and/or below the second display area DA2, for example, the connection wiring CWL may extend in the same direction as a direction in which the scan line SL extends and in the same direction as a direction in which the data line DL extends. However, the present disclosure is not limited thereto. For example, in some embodiments, when the intermediate area MA is located above and/or below the second display area DA2, the connection wiring CWL may extend in the same direction as a direction in which the data line DL extends.

In an embodiment, the number of the second pixel circuits PC2 located in the intermediate area MA per unit area may be equal to or less than the number of the first pixel circuits PC1 located in the first display area DA1 per unit area.

As described above, an arrangement of the second pixel circuits PC2 may be modified in various suitable ways, and because the second pixel circuit PC2 is not located in the second display area DA2, the area of the transmissive area TA may be sufficiently secured and thus a light transmittance of the second display area DA2 may be increased.

Figure 5G:
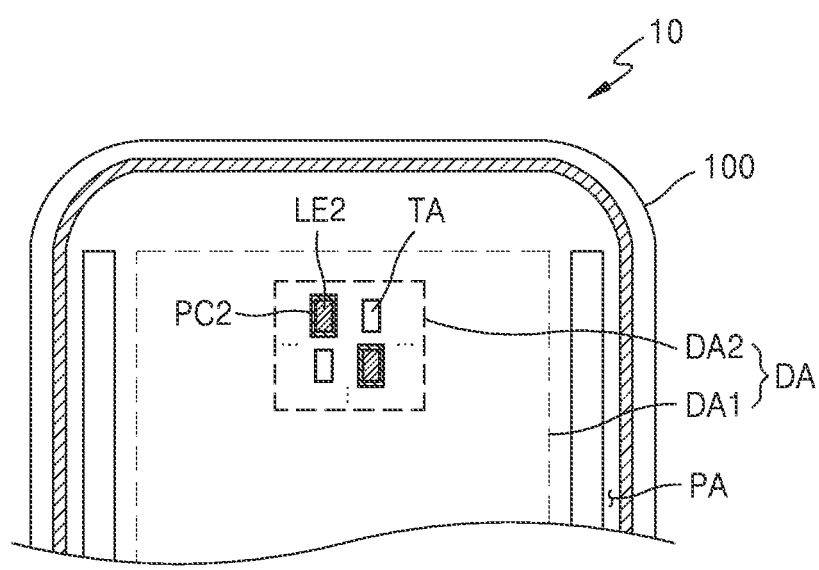

Although the second pixel circuit PC2 is not located in the second display area DA2 in FIGS. 5A through 5F, the present disclosure is not limited thereto. As shown in FIG. 5G, the second pixel circuit PC2 may be located in the second display area DA2. The second pixel circuit PC2 and the second light-emitting device LE2 may overlap each other, and may be connected (e.g., electrically connected) to each other by a contact electrode. In the present embodiment, because the transmissive area TA is located in the second display area DA2, a sufficient light transmittance may be secured.

Figure 6A:
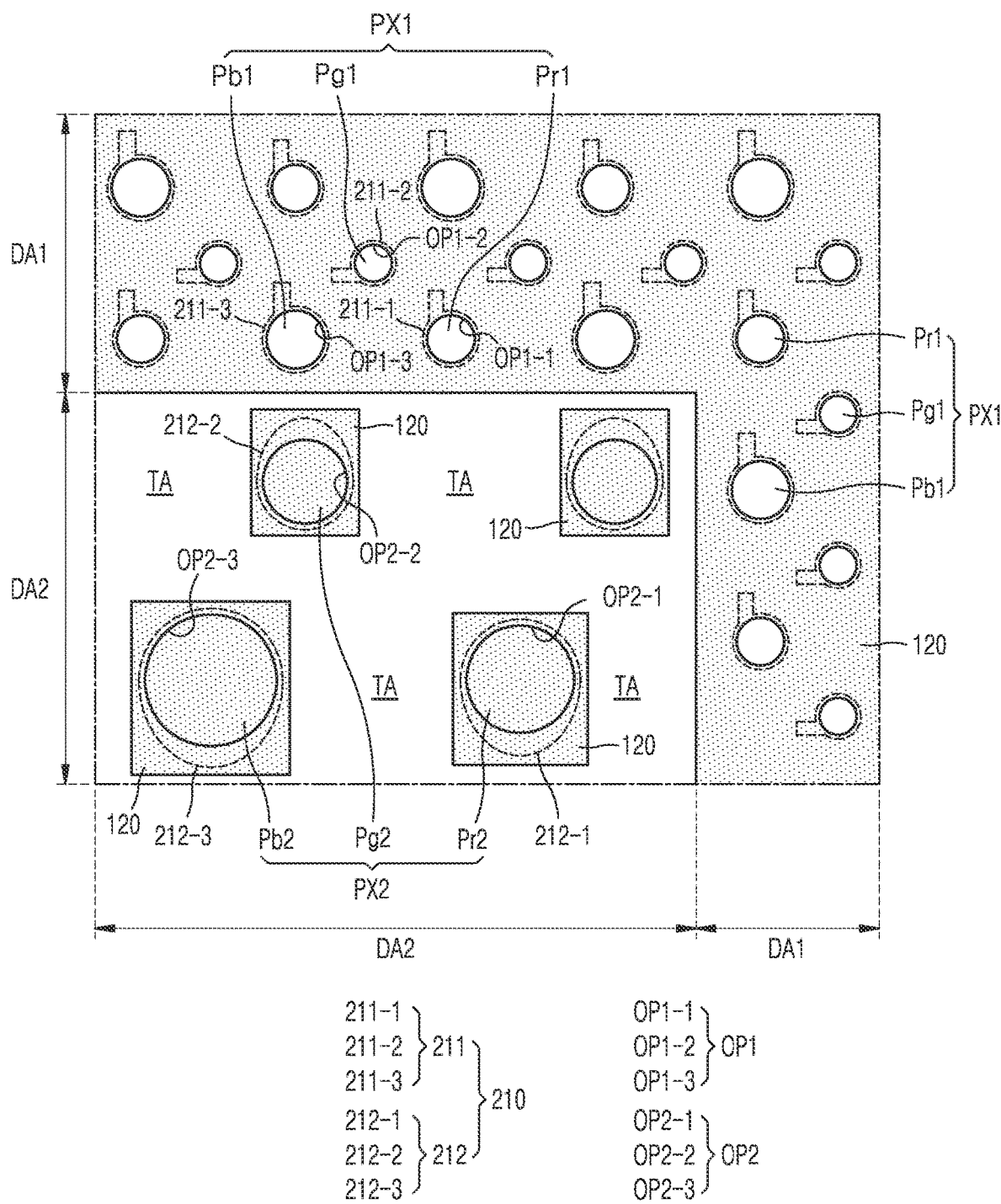
FIGS. 6A and 6B are plan views illustrating some elements of a display apparatus provided in an electronic device, according to embodiments.
Figure 6B:
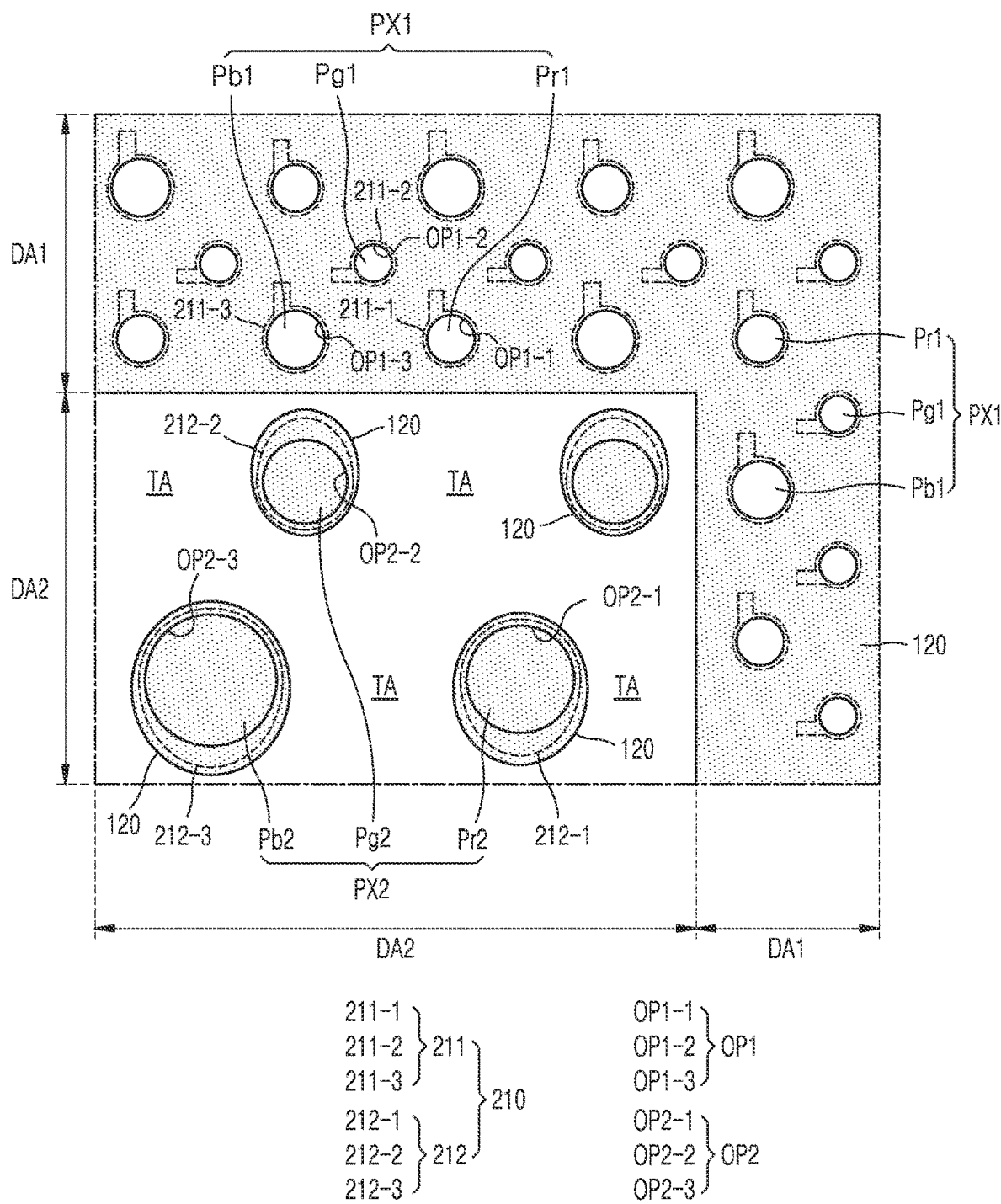

FIGS. 6A and 6B are plan views illustrating some elements of a display apparatus, particularly, a first display area and a second display area of the display apparatus, provided in an electronic device, according to an embodiment.

Referring to FIG. 6A, a plurality of first pixel electrodes 211 may be located in the first display area DA1, to be spaced from one another in a plan view. The plurality of first pixel electrodes 211 may include a 1-1$^{th}$ pixel electrode 211-1, a 1-2$^{th}$ pixel electrode 211-2, and a 1-3$^{th}$ pixel electrode 211-3 having different areas from each other. In an embodiment, the area of the 1-1$^{th}$ pixel electrode 211-1 may be greater than the area of the 1-2$^{th}$ pixel electrode 211-2, and the area of the 1-3$^{th}$ pixel electrode 211-3 may be greater than the area of the 1-1$^{th}$ pixel electrode 211-1.

A plurality of second pixel electrodes 212 may be located in the second display area DA2, to be spaced from one another in a plan view. The transmissive area TA may be located between the plurality of second pixel electrodes 212. The plurality of second pixel electrodes 212 may include a 2-1$^{th}$ pixel electrode 212-1, a 2-2$^{th}$ pixel electrode 212-2, and a 2-3$^{th}$ pixel electrode 212-3 having different areas from each other. In an embodiment, the area of the 2-1$^{th}$ pixel electrode 212-1 may be greater than the area of the 2-2$^{th}$ pixel electrode 212-2, and the area of the 2-3$^{th}$ pixel electrode 212-3 may be greater than the area of the 2-1$^{th}$ pixel electrode 212-1.

In an embodiment, the area of each second pixel electrodes 212 may be greater than the area of each first pixel electrodes 211. For example, the areas of the 2-1$^{th}$ pixel electrode 212-1, the 2-2$^{th}$ pixel electrode 212-2, and the 2-3$^{th}$ pixel electrode 212-3 may be greater than the areas of the 1-1$^{th}$ pixel electrode 211-1, the 1-2$^{th}$ pixel electrode 211-2, and the 1-3$^{th}$ pixel electrode 211-3.

A pixel-defining film 120 may be located on the plurality of first pixel electrodes 211 and the plurality of second pixel electrodes 212. Because a plurality of pixel electrodes 210 are located under the pixel-defining film 120, an edge of each pixel electrode 210 is marked by a dashed line in FIG. 6A.

The pixel-defining film 120 may include a plurality of first openings OP1 through which portions, for example, central portions, of the plurality of first pixel electrodes 211 are exposed, and a plurality of second openings OP2 through which portions, for example, central portions, of the plurality of second pixel electrodes 212 are exposed.

The plurality of first openings OP1 may include a 1-1$^{th}$ opening OP1-1, a 1-2$^{th}$ opening OP1-2, and a 1-3$^{th}$ opening OP1-3 respectively corresponding to the 1-1$^{th}$ pixel electrode 211-1, the 1-2$^{th}$ pixel electrode 211-2, and the 1-3$^{th}$ pixel electrode 211-3. In an embodiment, the area of the 1-1$^{th}$ opening OP1-1 may be greater than the area of the 1-2$^{th}$ opening OP1-2, and the area of the 1-3$^{th}$ opening OP1-3 may be greater than the area of the 1-1$^{th}$ opening OP1-1.

The plurality of second openings OP2 may include a 2-1$^{th}$ opening OP2-1, a 2-2$^{th}$ opening OP2-2, and a 2-3$^{th}$ opening OP2-3 respectively corresponding to the 2-1$^{th}$ pixel electrode 212-1, the 2-2$^{th}$ pixel electrode 212-2, and the 2-3$^{th}$ pixel electrode 212-3. In an embodiment, the area of the 2-1$^{th}$ opening OP2-1 may be greater than the area of the 2-2$^{th}$ opening OP2-2, and the area of the 2-3$^{th}$ opening OP2-3 may be greater than the area of the 2-1$^{th}$ opening OP2-1.

In an embodiment, in a plan view, the area of each second openings OP2 may be greater than the area of each first openings OP1. For example, the areas of the 2-1$^{th}$ opening OP2-1, the 2-2$^{th}$ opening OP2-2, and the 2-3$^{th}$ opening OP2-3 may be greater than the areas of the 1-1$^{th}$ opening OP1-1, the 1-2$^{th}$ opening OP1-2, and the 1-3$^{th}$ opening OP1-3.

In some embodiments, an intermediate layer including an emission layer that emits light of a certain color may be located on the first pixel electrode 211 and the second pixel electrode 212, and may be located in the first opening OP1 and the second opening OP2 of the pixel-defining film 120. For example, an intermediate layer including a red emission layer may be located in the 1-1$^{th}$ opening OP1-1 and the 2-1$^{th}$ opening OP2-1, an intermediate layer including a green emission layer may be located in the 1-2$^{th}$ opening OP1-2 and the 2-2$^{th}$ opening OP2-2, and an intermediate layer including a blue emission layer may be located in the 1-3$^{th}$ opening OP1-3 and the 2-3$^{th}$ opening OP2-3.

A counter electrode may be located on the pixel-defining film 120 and the intermediate layer, and may be integrally formed with the plurality of pixel electrodes 210.

A stacked structure of the pixel electrode 210, the intermediate layer, and the counter electrode may constitute one organic light-emitting diode OLED that is one light-emitting device LE. One first opening OP1 of the pixel-defining film 120 may correspond to one first light-emitting device LE1 (e.g., see FIG. 3), and may define one emission area. That is, the first opening OP1 of the pixel-defining film 120 may define the first pixel PX1. Also, one second opening OP2 of the pixel-defining film 120 may correspond to one second light-emitting device LE2 (e.g., see FIG. 3), may define one emission layer, and thus may define the second pixel PX2.

The plurality of first pixels PX1 may be located in the first display area DA1, and the plurality of second pixels PX2 may be located in the second display area DA2. In an embodiment, the plurality of first pixels PX1 may include a red first pixel Pr1, a green first pixel Pg1, and a blue first pixel Pb1. The red first pixel Pr1, the green first pixel Pg1, and the blue first pixel Pb1 may respectively emit red light, green light, and blue light. The red first pixel Pr1 may overlap the 1-1$^{th}$ pixel electrode 211-1, and may be defined by the 1-1$^{th}$ opening OP1-1. The green first pixel Pg1 may overlap the 1-2$^{th}$ pixel electrode 211-2, and may be defined by the 1-2$^{th}$ opening OP1-2. The blue first pixel Pb1 may overlap the 1-3$^{th}$ pixel electrode 211-3, and may be defined by the 1-3$^{th}$ opening OP1-3.

Likewise, the plurality of second pixels PX2 may include a red second pixel Pr2, a green second pixel Pg2, and a blue second pixel Pb2. The red second pixel Pr2, the green second pixel Pg2, and the blue second pixel Pb2 may respectively emit red light, green light, and blue light. The red second pixel Pr2 may overlap the 2-1$^{th}$ pixel electrode 212-1, and may be defined by the 2-1$^{th}$ opening OP2-1. The green second pixel Pg2 may overlap the 2-2$^{th}$ pixel electrode 212-2, and may be defined by the 2-2$^{th}$ opening OP2-2. The blue second pixel Pb2 may overlap the 2-3$^{th}$ pixel electrode 212-3, and may be defined by the 2-3$^{th}$ opening OP2-3. Red light may be light in a wavelength band of 580 nm to 780 nm, green light may be light in a wavelength band of 495 nm to 580 nm, and blue light may be light in a wavelength band of 400 nm to 495 nm.

In an embodiment, in a plan view, the area of the second pixel PX2 may be greater than the area of the first pixel PX1. For example, the area of the red second pixel PX2 may be greater than the area of the red first pixel PX1, the area of the green second pixel PX2 may be greater than the area of the green first pixel PX1, and the area of the blue second pixel PX2 may be greater than the area of the blue first pixel PX1. To this end, as described above, the area of the second pixel electrode 212 may be greater than the area of the first pixel electrode 211, and the area of the second opening OP2 of the pixel-defining film 120 may be greater than the area of the first opening OP1.

Because the second display area D2 includes the transmissive area TA, a resolution of the second display area DA2 may be lower than that of the first display area DA1. However, as described above, because the area of the second pixel PX2 located in the second display area DA2 is greater than the area of the first pixel PX1 located in the first display area DA1, luminances of the first display area DA1 and the second display area DA2 may be maintained to be the same or substantially the same.

Although the plurality of first pixels PX1 and the plurality of second pixels PX2 are arranged in an RGBG type (e.g., a PENTILE® structure, PENTILE® is a registered trademark of Samsung Display Co., Ltd., Republic of Korea) in FIG. 6A, the plurality of first pixels PX1 and the plurality of second pixels PX2 may be arranged in any of various suitable types such as a stripe type. Also, a planar shape of each of the first pixel PX1 and the second pixel PX2 is not limited to a circular shape, and may be any of various suitable shapes such as a polygonal shape (e.g., a triangular shape or a quadrangular shape) or an elliptical shape.

In the second display area DA2, the pixel-defining film 120 may not be located in the transmissive area TA. The pixel-defining films 120 may be spaced from one another to respectively correspond to the 2-1$^{th}$ pixel electrode 212-1, the 2-2$^{th}$ pixel electrode 212-2, and the 2-3$^{th}$ pixel electrode 212-3. Although an outer shape of the pixel-defining film 120 located in the second display area DA2 is a quadrangular shape in FIG. 6A, the present disclosure is not limited thereto.

As shown in FIG. 6B, an outer shape of the pixel-defining film 120 located in the second display area DA2 may be an elliptical shape. Alternatively, an outer shape of the pixel-defining film 120 located in the second display area DA2 may be modified to any of various suitable shapes such as a circular shape or a polygonal shape (e.g., a polygonal shape having six or more sides).

Also, although sizes of the second pixel electrode 212 and the second pixel PX2 located in the second display area DA2 are greater than sizes of the first pixel electrode 211 and the first pixel PX1 located in the first display area DA1 in FIGS. 6A and 6B, the present disclosure is not limited thereto. Various suitable modifications may be made. For example, sizes of the second pixel electrode 212 and the second pixel PX2 may be the same as sizes of the first pixel electrode 211 and the first pixel PX1.

Figure 7:
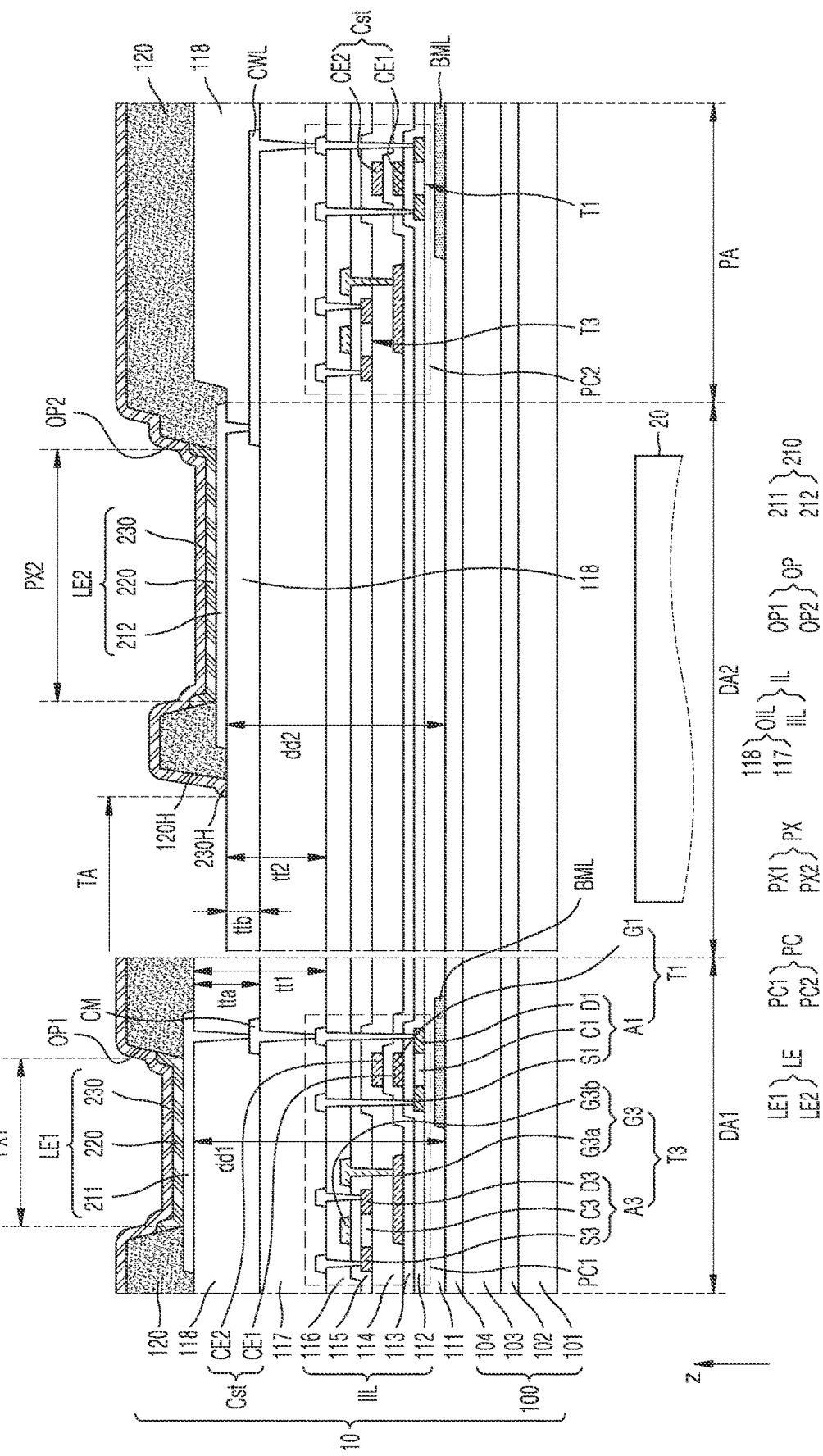
FIG. 7 is a cross-sectional view illustrating a part of a display apparatus provided in an electronic device, according to an embodiment.

FIG. 7 is a cross-sectional view illustrating a part of a display apparatus provided in an electronic device, according to an embodiment.

Referring to FIG. 7, the display apparatus 10 may include the substrate 100, and the substrate 100 may include glass or a polymer resin. For example, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). When the substrate 100 includes a polymer resin, the substrate 100 may be flexible or bendable.

The substrate 100 may have a single or multi-layer structure including the above material, and when the substrate 100 has a multi-layer structure, the substrate 100 may further include an inorganic layer. For example, the substrate 100 may include a first base layer 101, a first barrier layer 102, a second base layer 103, and a second barrier layer 104 that are sequentially stacked. Each of the first base layer 101 and the second base layer 103 may include a polymer resin. Each of the first barrier layer 102 and the second barrier layer 104 which is a barrier layer for preventing or reducing penetration of an external foreign material may have a single or multi-layer structure including an inorganic material such as silicon nitride ($SiN_x$) or silicon oxide ($SiO_x$).

The buffer layer 111 may be located on the substrate 100. The buffer layer 111 may planarize a top surface of the substrate 100, and may include an oxide film such as silicon oxide ($SiO_x$), and/or a nitride film such as silicon nitride ($SiN_x$), or silicon oxynitride ($SiO_xN_y$).

A plurality of pixel circuits PC may be located on the buffer layer 111. The plurality of pixel circuits PC may include a plurality of first pixel circuits PC1 located in the first display area DA1 and a plurality of second pixel circuits PC2 located in the peripheral area PA. The first pixel circuit PC1 may be connected (e.g., electrically connected) to the first light-emitting device LE1 located in the first display area DA1, and the second pixel circuit PC2 may be connected (e.g., electrically connected) to the second light-emitting device LE2 located in the second display area DA2. In an embodiment, although each of the first and second pixel circuits PC1 and PC2 includes the first through seventh thin-film transistors T1, T2, T3, T4, T5, T6, and T7, for convenience of explanation, only the first thin-film transistor T1 and the third thin-film transistor T3 are illustrated in FIG. 7. Also, in an embodiment, because the first pixel circuit PC1 and the second pixel circuit PC2 have the same configuration and structure, for convenience of explanation, the following will focus on the first pixel circuit PC1.

A silicon semiconductor layer including a silicon semiconductor material may be located on the buffer layer 111. In FIG. 7, a first semiconductor layer A1 of the first thin-film transistor T1 is illustrated as a silicon semiconductor layer. The first semiconductor layer A1 may include a first channel region C1, and a first source region S1 and a first drain region D1 located at opposite sides of the first channel region C1. For example, a source region and a drain region may be doped with impurities, and the impurities may include N-type impurities or P-type impurities. A channel region overlapping a gate electrode described below may not be doped with impurities or may include a very small amount of impurities. The source region and the drain region may respectively correspond to a source electrode and a drain electrode of each thin-film transistor. The source region and the drain region may be changed from each other according to the characteristics of the thin-film transistor.

A first gate insulating layer 112 may be located on the first semiconductor layer A1. The first gate insulating layer 112 may include an inorganic material including oxide or nitride. For example, the first gate insulating layer 112 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

A first gate electrode G1 may be located on the first gate insulating layer 112. The first gate electrode G1 may at least partially overlap the first semiconductor layer A1. For example, the first gate electrode G1 may overlap the first channel region C1 of the first semiconductor layer A1. The first gate electrode G1 of the first thin-film transistor T1 may include a low-resistance conductive material such as molybdenum (Mo), aluminum (Al), copper (Cu), and/or titanium (Ti), and may have a single or multi-layer structure including the above material. Also, a third lower gate electrode G3a may be located on the first gate insulating layer 112. The third lower gate electrode G3a may at least partially overlap a third semiconductor layer A3 described below. The third lower gate electrode G3a may include the same material as that of the first gate electrode G1.

The first capacitor Cst may include the first electrode CE1 and the second electrode CE2. In an embodiment, the first capacitor Cst may overlap the first thin-film transistor T1. In this case, the first gate electrode G1 may function not only as a gate electrode of the first thin-film transistor T1 but also as the first electrode CE1. That is, the first gate electrode G1 may be integrally formed with the first electrode CE1. The first electrode CE1 may be formed in an island shape. In another embodiment, the first capacitor Cst may not overlap the first thin-film transistor T1, and may be located at a separate location.

A second gate insulating layer 113 may be located on the first gate electrode G1. The second gate insulating layer 113 may include an inorganic material including oxide or nitride. For example, the second gate insulating layer 113 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

The second electrode CE2 of the first capacitor Cst may overlap the first electrode CE1. In this case, the second gate insulating layer 113 may be located between the first electrode CE1 and the second electrode CE2, and may function as a dielectric layer of the first capacitor Cst. Storage capacitance may be determined by a voltage between the first and second electrodes CE1 and CE2 and a charge accumulated in the first capacitor Cst.

The second electrode CE2 of the first capacitor Cst may include a metal, an alloy, a conductive metal oxide, or a transparent conductive material. The second electrode CE2 may include at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single or multi-layer structure including the above material.

A first interlayer insulating layer 114 may be located on the second electrode CE2 of the first capacitor Cst. The first interlayer insulating layer 114 may include an inorganic material including oxide or nitride. For example, the first interlayer insulating layer 114 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

A semiconductor layer including a material different from that of the first semiconductor layer A1 may be located on the first interlayer insulating layer 114. For example, an oxide-based semiconductor layer including an oxide semiconductor may be located on the first interlayer insulating layer 114. The oxide-based semiconductor layer may include a Zn oxide-based material such as Zn oxide, In—Zn oxide, or Ga—In—Zn oxide. In some embodiments, the oxide-based semiconductor layer may include In—Ga—Zn—O (IGZO), In—Sn—Zn—O (ITZO), or In—Ga—Sn—Zn—O (IGTZO) containing a metal such as indium (In), gallium (Ga), or tin (Sn) in ZnO. In FIG. 7, the third semiconductor layer A3 of the third thin-film transistor T3 is illustrated as an oxide semiconductor layer. The third semiconductor layer A3 may include a third channel region C3, and a third source region S3 and a third drain region D3 at opposite sides of the third channel region C3.

A third gate insulating layer 115 may be located on the third semiconductor layer A3 of the third thin-film transistor T3. The third gate insulating layer 115 may include an inorganic material including oxide or nitride. For example, the third gate insulating layer 115 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and hafnium oxide ($HfO_2$).

A third upper gate electrode G3b of the third thin-film transistor T3 may be located on the third gate insulating layer 115. The third upper gate electrode G3b may overlap at least a part of the third semiconductor layer A3 of the third thin-film transistor T3. For example, the third upper gate electrode G3b may overlap the third channel region C3 of the third semiconductor layer A3. Also, the third upper gate electrode G3b may overlap the third lower gate electrode G3a. The third upper gate electrode G3b may be connected (e.g., electrically connected) to the third lower gate electrode G3a through a contact hole formed in the first interlayer insulating layer 114 and the third gate insulating layer 115, to form a double gate structure. The third upper gate electrode G3b may include a low-resistance conductive material such as molybdenum (Mo), aluminum (Al), copper (Cu), and/or titanium (Ti), and may have a single or multi-layer structure including the above material.

A second interlayer insulating layer 116 may be located on the third upper gate electrode G3b of the third thin-film transistor T3. The second interlayer insulating layer 116 may cover the third thin-film transistor T3. The second interlayer insulating layer 116 may include an inorganic material including oxide or nitride. For example, the second interlayer insulating layer 116 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and hafnium oxide ($HfO_2$).

A source electrode SE and a drain electrode DE may be located on the second interlayer insulating layer 116. Each of the source electrode SE and the drain electrode DE may include a conductive material including molybdenum (Mo), aluminum (Al), copper (Cu), or titanium (Ti), and may have a single or multi-layer structure including the above material. For example, each of the source electrode SE and the drain electrode DE may have a multi-layer structure including Ti/Al/Ti.

The first gate insulating layer 112, the second gate insulating layer 113, the first interlayer insulating layer 114, the third gate insulating layer 115, and the second interlayer insulating layer 116 may be referred to as an inorganic insulating layer IIL.

An organic insulating layer OIL may be located on the second interlayer insulating layer 116. The organic insulating layer OIL may cover the first display area DA1 and the second display area DA2, and may be located on the first pixel circuit PC1 and the second pixel circuit PC2. The organic insulating layer OIL may function as a protective film covering the pixel circuit PC, and a top surface of the organic insulating layer OIL may be planarized (i.e., may become flat or substantially flat). The organic insulating layer OIL may have a single or multi-layer structure. In an embodiment, the organic insulating layer OIL may include a first organic layer 117, and a second organic layer 118 on the first organic layer 117. Each of the first organic layer 117 and the second organic layer 118 may include an organic material such as acryl, benzocyclobutene (BCB), polyimide, or hexamethyldisiloxane (HMDSO).

When the organic insulating layer OIL includes the first organic layer 117 and the second organic layer 118, a contact metal CM and the connection wiring CWL may be located between the first organic layer 117 and the second organic layer 118.

The contact metal CM may connect (e.g., electrically connect) the first pixel circuit PC1 to the first light-emitting device LE1. The contact metal CM may include a conductive material including molybdenum (Mo), aluminum (Al), copper (Cu), or titanium (Ti), and may have a single or multi-layer structure including the above material. For example, the contact metal CM may have a multi-layer structure including Ti/Al/Ti.

The connection wiring CWL may connect (e.g., electrically connect) the second pixel circuit PC2 to the second light-emitting device LE2. In an embodiment, the connection wiring CWL may be formed of the same material as that of the contact metal CM. In another embodiment, the connection wiring CWL may include a transparent conductive material. The connection wiring CWL may include, for example, a transparent conductive oxide (TCO). The connection wiring CWL may include a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO).

A plurality of pixel electrodes 210 may be located on the organic insulating layer OIL. The plurality of pixel electrodes 210 may include a plurality of first pixel electrodes 211 located in the first display area DA1 and a plurality of second pixel electrodes 212 located in the second display area DA2. The pixel electrode 210 may include a light-transmitting conductive layer formed of a light-transmitting conductive oxide such as ITO, $In_2O_3$, or IZO, and a reflective layer formed of a metal such as Al or Ag. For example, the pixel electrode 210 may have a three-layer structure including ITO/Ag/ITO.

The pixel-defining film 120 may be located on the pixel electrode 210, and the pixel-defining film 120 may define the pixel PX by having an opening corresponding to each pixel PX, that is, an opening OP through which at least a central portion of the pixel electrode 210 is exposed. For example, the pixel-defining film 120 may define the first pixel PX1 by having a first opening OP1 through which a central portion of the first pixel electrode 211 is exposed, and may define the second pixel PX2 by having a second opening OP2 through which a central portion of the second pixel electrode 212 is exposed. Also, the pixel-defining film 120 may increase a distance between an edge of the pixel electrode 210 and a counter electrode 230, thereby preventing or substantially preventing an arc or the like from occurring between the edge of the pixel electrode 210 and the counter electrode 230.

The pixel-defining film 120 may include an organic insulating material. Alternatively, the pixel-defining film 120 may include an inorganic insulating material such as silicon nitride, silicon oxynitride, and/or silicon oxide. Alternatively, the pixel-defining film 120 may include an organic insulating material and an inorganic insulating material.

In an embodiment, the pixel-defining film 120 may include a light-blocking material, and may be black. The light-blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride). When the pixel-defining film 120 includes a light-blocking material, reflection of external light by metal structures located under the pixel-defining film 120 may be reduced.

An intermediate layer 220 may be located on the pixel-defining film 120. The intermediate layer 220 may be located between the pixel electrode 210 and the counter electrode 230. The intermediate layer 220 may include an emission layer overlapping the pixel electrode 210. The emission layer may include an organic light-emitting material such as a high molecular weight organic material or a low molecular weight organic material emitting light of a certain color. Alternatively, the emission layer may include an inorganic light-emitting material or may include quantum dots.

In an optional embodiment, functional layers such as a hole transport layer (HTL), a hole injection layer (HIL), an electron transport layer (ETL), and an electron injection layer (EIL) may be further located under and over the emission layer. For example, a first functional layer from among the functional layers may be a hole transport layer (HTL) formed of poly-(3,4)-ethylene-dihydroxy thiophene (PEDOT) or polyaniline (PANI). Alternatively, the first functional layer may include a hole injection layer (HIL) and a hole transport layer (HTL). A second functional layer 223 from among the functional layers may include an electron transport layer (ETL) and/or an electron injection layer (EIL).

The counter electrode 230 may be located on the intermediate layer 220, and may cover a portion of the second display area DA2 and the first display area DA1. The counter electrode 230 may be integrally formed to cover the plurality of pixel electrodes 210. The counter electrode 230 may extend from the first display area DA1 and the second display area DA2 to the peripheral area PA. The counter electrode 230 may be formed of a conductive material having a low work function. For example, the counter electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer formed of ITO, IZO, ZnO, or $In_2O_3$ on the (semi)transparent layer including the above material.

A stacked structure of the pixel electrode 210, the intermediate layer 220, and the counter electrode 230 may constitute an organic light-emitting diode OLED as the light-emitting device LE. For example, a stacked structure of the first pixel electrode 211, the intermediate layer 220, and the counter electrode 230 may constitute the first light-emitting device LE1, and a stacked structure of the second pixel electrode 212, the intermediate layer 220, and the counter electrode 230 may constitute the second light-emitting device LE2.

An emission area of the light-emitting device LE may be defined as the pixel PX. Because the opening OP of the pixel-defining film 120 defines a size and/or a width of the emission area, a size and/or a width of the pixel PX may depend on a size and/or a width of the opening OP of the pixel-defining film 120.

The electronic component 20 may overlap the second display area DA2, and the transmissive area TA through which light emitted from the electronic component 20 or traveling to the electronic component 20 is transmitted may be located in the second display area DA2. In some embodiments, the pixel-defining film 120 and the counter electrode 230 may be located in the transmissive area TA and may respectively have holes 120H and 230H overlapping (e.g., overlapping each other in the thickness direction of the substrate 100) each other. In another embodiment, the first gate insulating layer 112, the second gate insulating layer 113, the first interlayer insulating layer 114, the third gate insulating layer 115, the second interlayer insulating layer 116, the first organic layer 117, and the second organic layer 118 on the substrate 100 may have holes in the transmissive area TA and the holes of first gate insulating layer 112, the second gate insulating layer 113, the first interlayer insulating layer 114, the third gate insulating layer 115, the second interlayer insulating layer 116, the first organic layer 117, and the second organic layer 118 may overlap one another. Accordingly, a light transmittance in the transmissive area TA may be increased.

In an embodiment, a bottom metal layer BML may be located under the pixel circuit PC. The bottom metal layer BML may be located between the substrate 100 and the buffer layer 111. The bottom metal layer BML may overlap the first thin-film transistor T1 of each of the first pixel circuit PC1 and the second pixel circuit PC2. The bottom metal layer BML may not overlap (e.g., may not overlap in the thickness direction of the substrate 100) the transmissive area TA of the second display area DA2 so as to prevent or substantially prevent a decrease in a light transmittance in the transmissive area TA. In some embodiments, the bottom metal layer BML may be connected (e.g., electrically connected) to the pixel circuit PC, and may receive a constant voltage. Accordingly, the first thin-film transistor T1 of the pixel circuit PC may have stable electrical characteristics.

Also, the bottom metal layer BML may include a light-blocking material, and the light-blocking material may include, for example, a metal material such as chromium (Cr) or molybdenum (Mo), black ink, and/or a dye. The bottom metal layer BML may prevent or substantially prevent light emitted from the electronic component 20 or reflected by the electronic component 20 from being incident on the second pixel circuit PC2 adjacent to the second display area DA2. Accordingly, the performance degradation of a thin-film transistor of the second pixel circuit PC2 due to the light may be minimized or reduced.

According to an embodiment, a thickness of the organic insulating layer OIL may vary according to the display area DA. A thickness tt2 of the organic insulating layer OIL in the second display area DA2 may be less than a thickness tt1 of the organic insulating layer OIL in the first display area DA1. For example, a thickness of the first organic layer 117 of the organic insulating layer OIL may be the same in the first display area DA1 and the second display area DA2, and a thickness ttb of the second organic layer 118 in the second display are DA2 may be less than a thickness tta of the second organic layer 118 in the first display area DA1. In another example, a thickness of the first organic layer 117 in the second display area DA2 may be less than a thickness of the first organic layer 117 in the first display area DA1.

Because a thickness of the organic insulating layer OIL varies according to the display area DA, a distance between the substrate 100 and the pixel electrode 210 may also vary according to the display area DA. For example, a distance dd2 between a bottom surface of the second pixel electrode 212 located in the second display area DA2 and a top surface of the substrate 100 may be less than a distance dd1 between a bottom surface of the first pixel electrode 211 located in the first display area DA1 and the top surface of the substrate 100.

Also, a distance between the connection wiring CWL and the second pixel electrode 212 in the second display area DA2 may be less than a distance between the contact metal CM and the first pixel electrode 211 in the first display area DA1.

A thickness of the organic insulating layer OIL located in the peripheral area PA may be substantially the same as a thickness of the organic insulating layer OIL located in the first display area DA1.

When heat is applied to the organic insulating layer OIL in a process of manufacturing the display apparatus 10, a material included in the organic insulating layer OIL may be partially evaporated. When gas generated in the organic insulating layer OIL is not sufficiently discharged to the outside of the display apparatus 10, the gas may affect the light-emitting device LE, the light-emitting device LE may be degraded, and thus defects such as failure of light emission or shrinkage of the light-emitting device LE may occur. As described above, because the second pixel electrode 212 is relatively large, discharge of the gas from the second display area DA2 may be delayed or interrupted by the second pixel electrode 212. Accordingly, the risk of malfunction of the second light-emitting device LE2 may be increased.

However, according to an embodiment, a volume of the organic insulating layer OIL in the second display area DA2 may be minimized or reduced by reducing the thickness tt2 of the organic insulating layer OIL in the second display area DA2. Accordingly, the amount of gas emitted from the organic insulating layer OIL in the second display area DA2 may be minimized or reduced, and thus the risk of malfunction and degradation of the second light-emitting device LE2 may be reduced.

Figure 8:
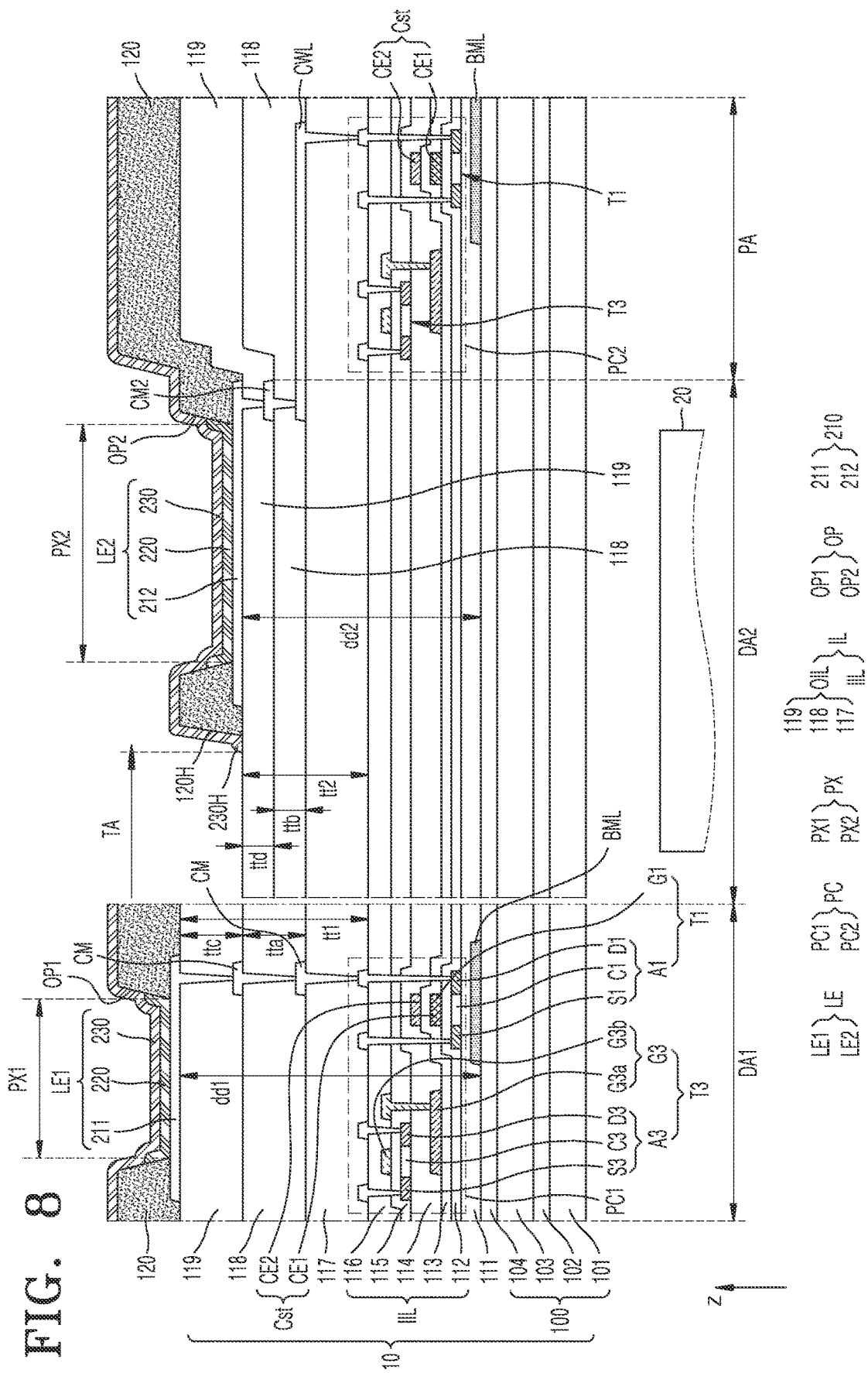
FIG. 8 is a cross-sectional view illustrating a part of a display apparatus provided in an electronic device, according to another embodiment.

FIG. 8 is a cross-sectional view illustrating a part of a display apparatus provided in an electronic device, according to another embodiment. Elements that are the same or substantially the same as those described with reference to FIG. 7 may not be described, and the following will focus on differences.

Referring to FIG. 8, the organic insulating layer OIL of the display apparatus 10 may further include a third organic layer 119 on the second organic layer 118. That is, the third organic layer 119 may be located between the second organic layer 118 and the pixel electrode 210. In this case, a contact metal CM2 may be located between the second organic layer 118 and the third organic layer 119. As such, because the third organic layer 119 is additionally provided, a degree of integration of the display apparatus 10 may be increased.

In an embodiment, a thickness ttd of the third organic layer 119 in the second display area DA2 may be less than a thickness ttc of the third organic layer 119 in the first display area DA1. Accordingly, a volume of the organic insulating layer OIL in the second display area DA2 may be minimized or reduced, and the amount of gas emitted from the organic insulating layer OIL in the second display area DA2 may be minimized or reduced, thereby reducing the risk of degradation and malfunction of the second light-emitting device LE2.

FIGS. 9A through 9H are cross-sectional views illustrating a method of manufacturing a display apparatus provided in an electronic device, according to an embodiment.

Figure 9A:
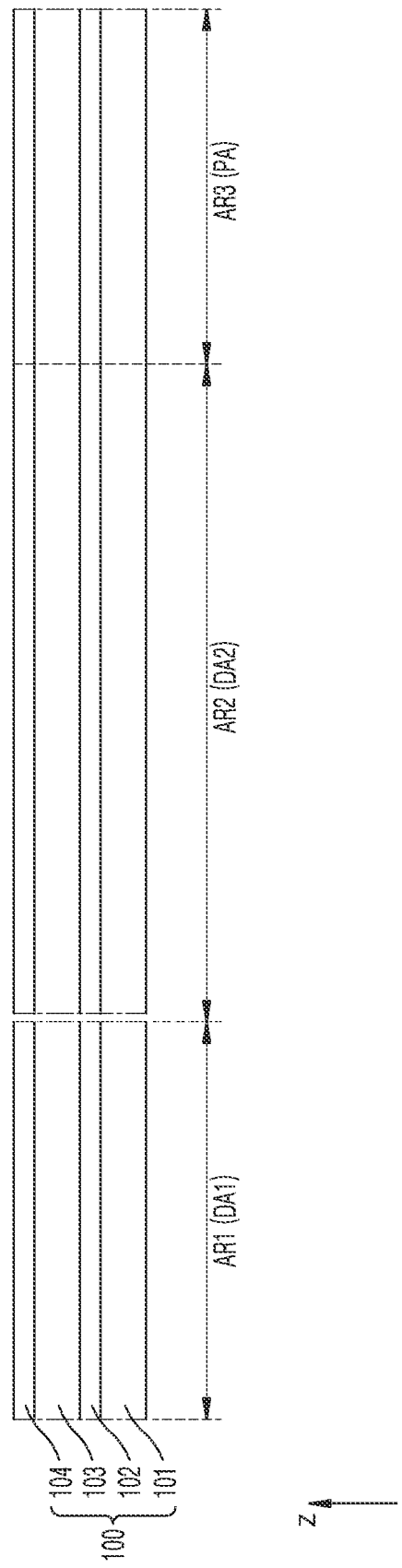
FIGS. 9A through 9H are cross-sectional views illustrating a method of manufacturing a display apparatus provided in an electronic device, according to an embodiment.

Referring to FIG. 9A, the substrate 100 including a first area AR1 and a second area AR2 adjacent to the first area AR1 may be prepared. Because the first display area DA1 and the second display area DA2 are areas where images are provided by the plurality of first pixels PX1 and the plurality of second pixels PX2, for the substrate 100 where pixels are not formed yet, areas corresponding to the first display area DA1 and the second display area DA2 are respectively referred to as the first area AR1 and the second area AR2. Also, the substrate 100 may include a third area AR3, and the third area AR3 may correspond to the peripheral area PA of the display apparatus 10.

Figure 9B:
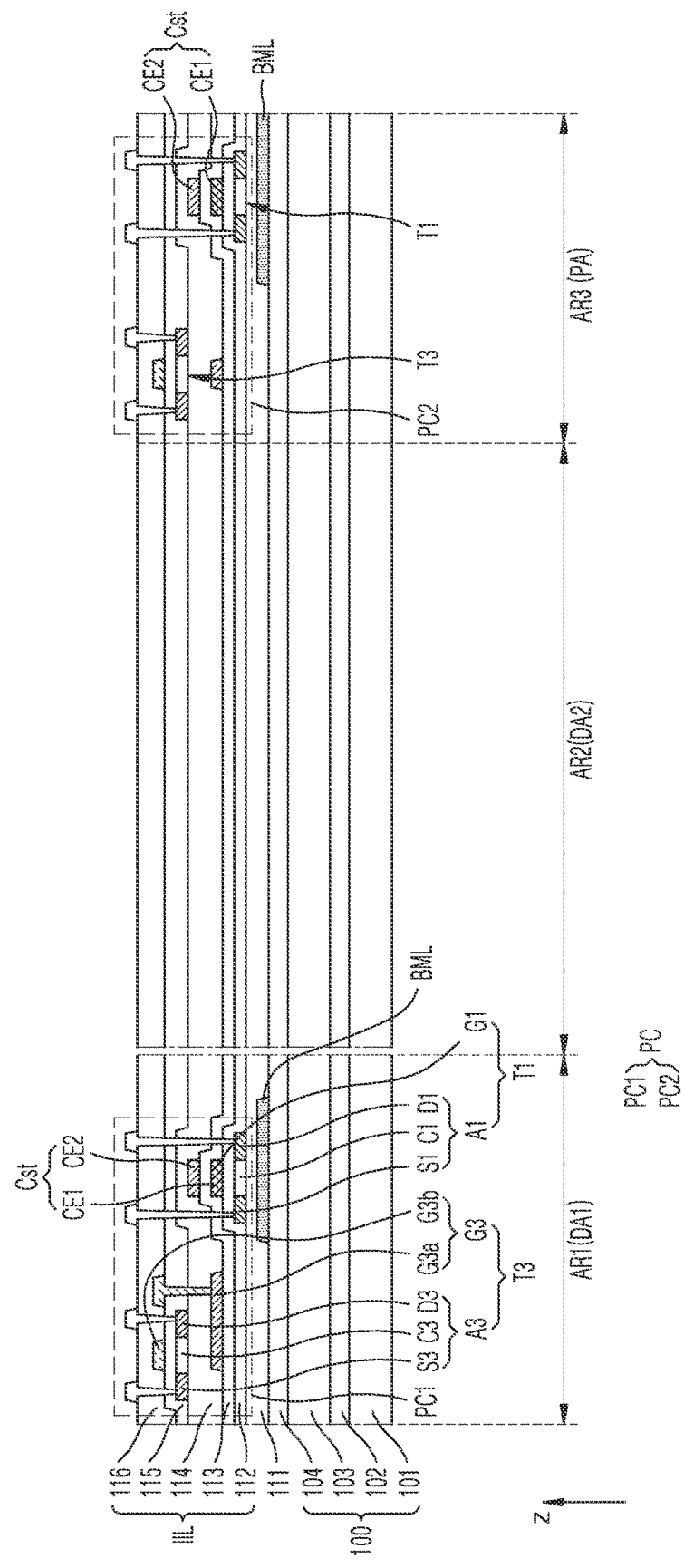

Referring to FIG. 9B, the buffer layer 111 and a plurality of pixel circuits PC may be formed on the substrate 100. For example, the buffer layer 111 may be formed over the entire area of the substrate 100. Next, the first pixel circuit PC1 may be formed in the first area AR1 of the substrate 100, and the second pixel circuit PC2 may be formed in the third area AR3.

To form the pixel circuit PC, various insulating layers, a semiconductor layer, and an electrode layer may be formed on the substrate 100. For example, after various material layers are formed by using a coating process or a deposition process, the various material layers may be patterned through a photolithography process and an etching process, to form the various insulating layers, the semiconductor layer, and the electrode layer.

Examples of the coating process may include spin coating, and examples of the deposition process may include chemical vapor deposition (CVD) such as thermal chemical vapor deposition (TCVD), plasma-enhanced chemical vapor deposition (PECVD), or atmospheric pressure chemical vapor deposition (APCVD), and physical vapor deposition (PVD) such as thermal evaporation, sputtering, or e-beam evaporation.

Referring to FIGS. 9C through 9G, the organic insulating layer OIL located on the first pixel circuit PC1 and the second pixel circuit PC2 and covering the first area AR1 and the second area AR2 of the substrate 100 may be formed. In an embodiment, the organic insulating layer OIL may be formed by using a halftone mask HM so that a thickness tt1 of the organic insulating layer OIL in the first area AR1 is less than a thickness t2 of the organic insulating layer OIL in the second area AR2.

Figure 9C:
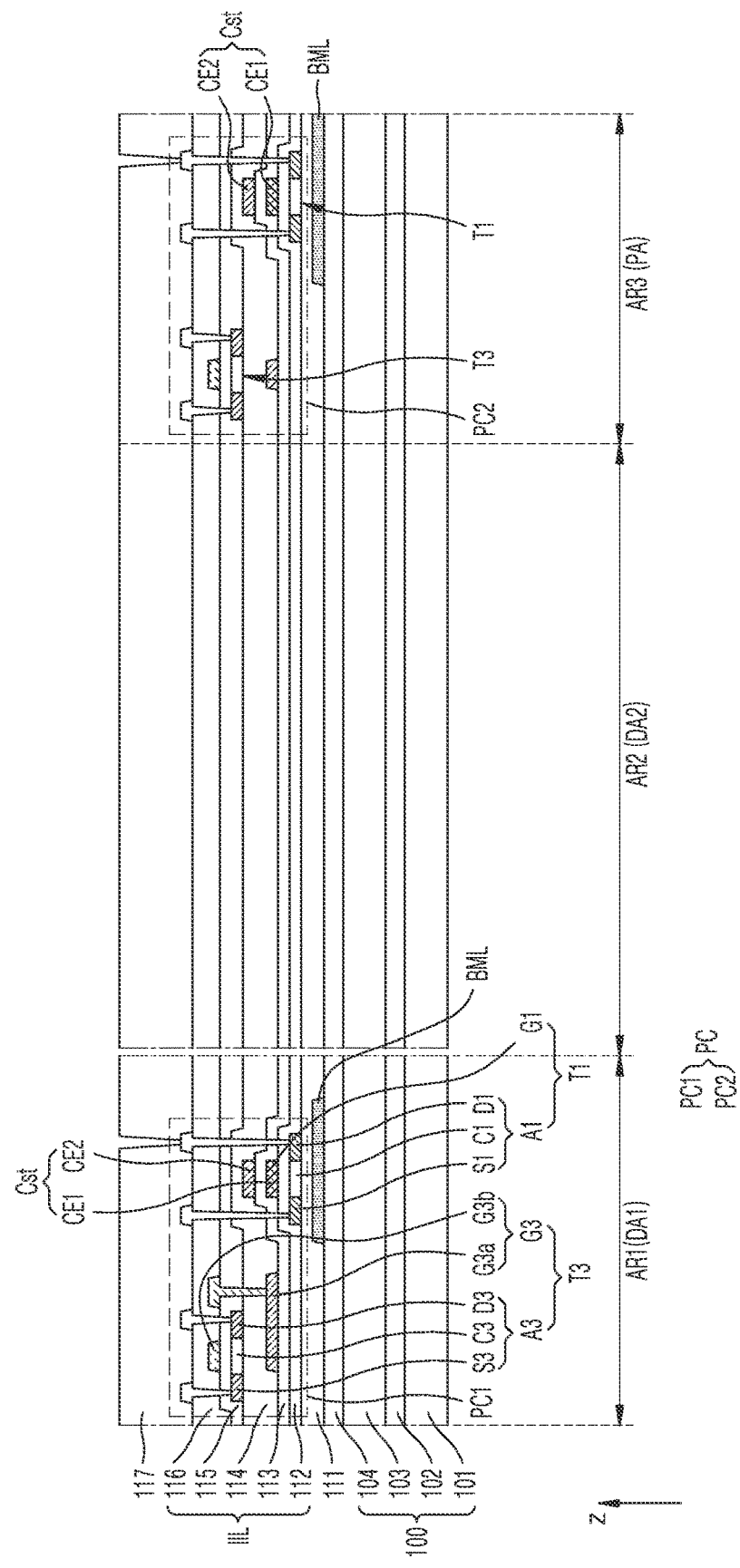

In more detail, referring to FIG. 9C, the first organic layer 117 located on the first pixel circuit PC1 and the second pixel circuit PC2 and covering the first area AR1 and the second area AR2 of the substrate 100 may be formed. To form the first organic layer 117, for example, a deposition process and a photolithography process may be performed. In some embodiments, although the first organic layer 117 has a uniform thickness in the first area AR1 and the second area AR2, the present disclosure is not limited thereto. As in a method of forming the second organic layer 118 described below, the first organic layer 117 may also have different thicknesses in the first area AR1 and the second area AR2.

Figure 9D:
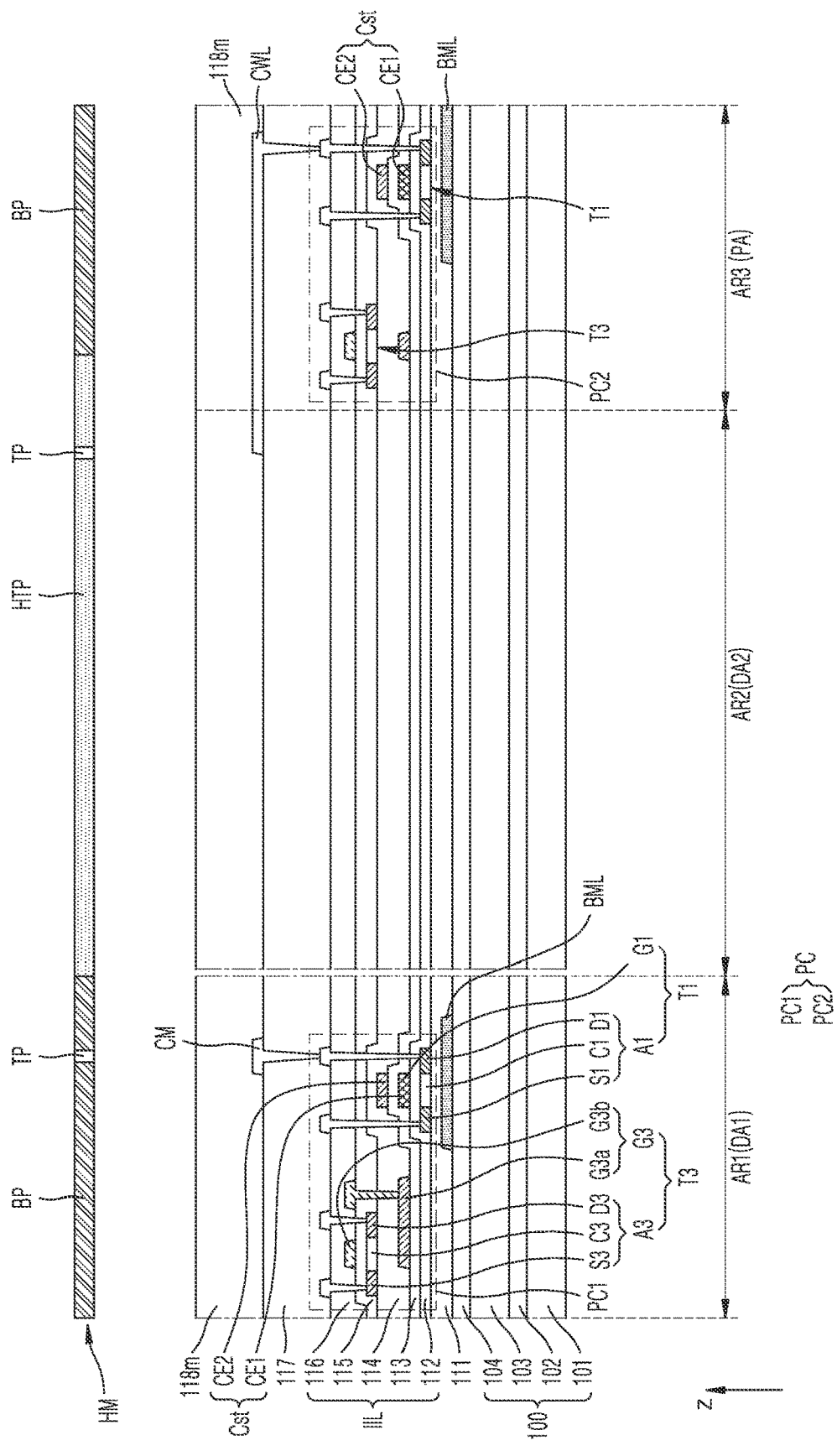

Referring to FIG. 9D, after the contact metal CM and the connection wiring CWL are formed on the first organic layer 117, a first material layer 118m may be formed. The contact metal CM and the connection wiring CWL may be formed through a coating process, a photolithography process, and an etching process. The first material layer 118m may be formed through a coating process or a deposition process. The first material layer 118m may cover the first area AR1 and the second area AR2, and may have a substantially uniform thickness.

Next, the first material layer 118m may be patterned by using the halftone mask HM. The halftone mask HM may include a transparent portion TP, a semi-transparent portion HTP, and a light-blocking portion BP. The transparent portion TP may allow most of light to pass therethrough. The semi-transparent portion HTP may allow part of light to pass therethrough. Accordingly, the amount of light exposure may be adjusted by using the semi-transparent portion HTP. The light-blocking portion BP may block most of light. For example, when the first material layer 118m is exposed to light through the halftone mask HM and then is developed, portions of the first material layer 118m respectively corresponding to the transparent portion TP and the semi-transparent portion HTP may be removed by different thicknesses, and a portion of the first material layer 118m corresponding to the light-blocking portion BP may not be removed.

Figure 9E:
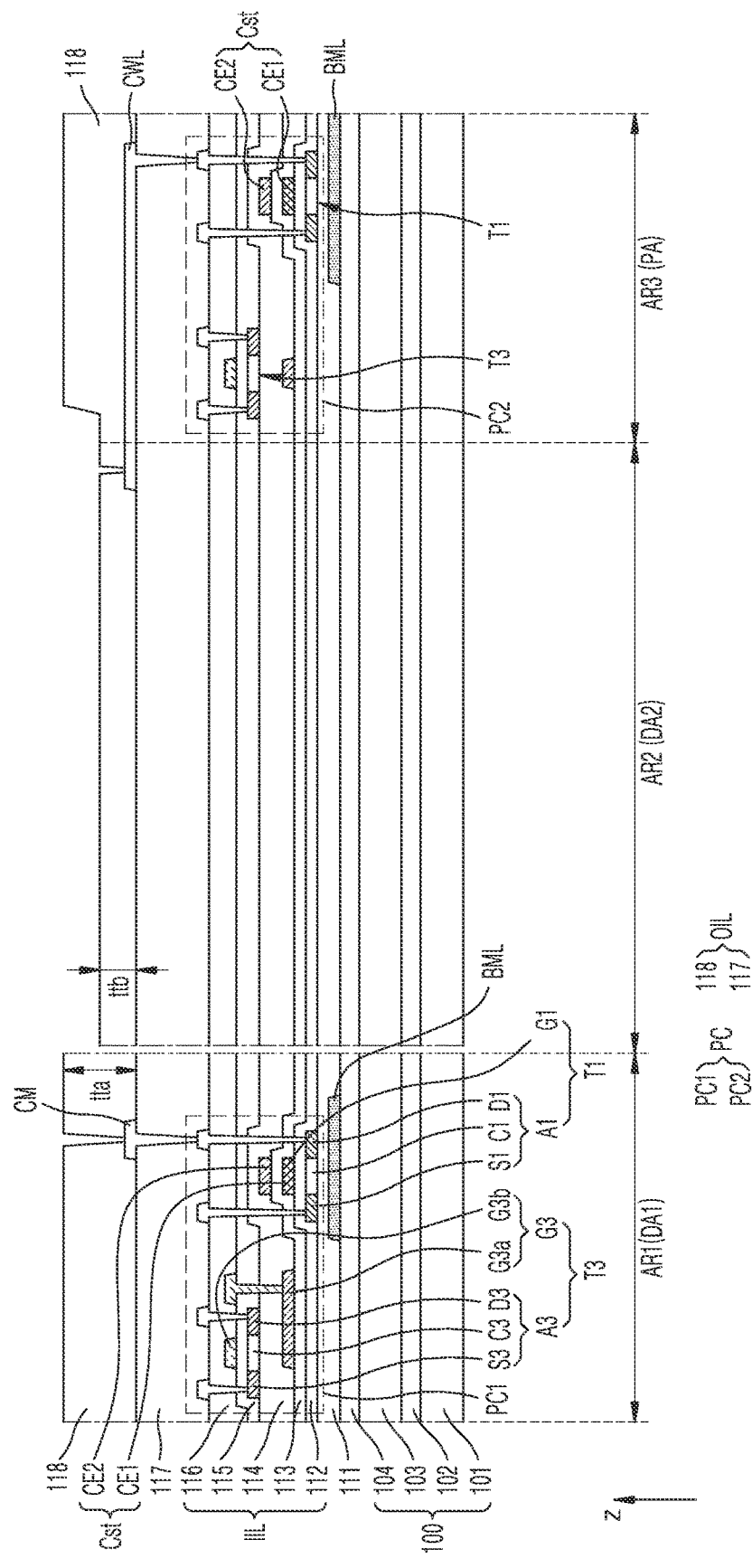

Referring to FIG. 9E, the second organic layer 118 may be formed by patterning the first material layer 118m (e.g., see FIG. 9D) by using the halftone mask HM. A portion corresponding to the semi-transparent portion HTP (e.g., see FIG. 9D) of the halftone mask HM (e.g., see FIG. 9D) may be the second area AR2, and a portion corresponding to the light-blocking portion BP (e.g., see FIG. 9D) of the halftone mask HM may be the first area AR1. Accordingly, the second organic layer 118 may be formed so that the thickness ttb of the second organic layer 118 in the second area AR2 is less than the thickness tta of the second organic layer 118 in the first area AR1. A portion corresponding to the transparent portion TP (e.g., see FIG. 9D) of the halftone mask HM may be a portion where a contact hole of the second organic layer 118 is located.

Figure 9F:
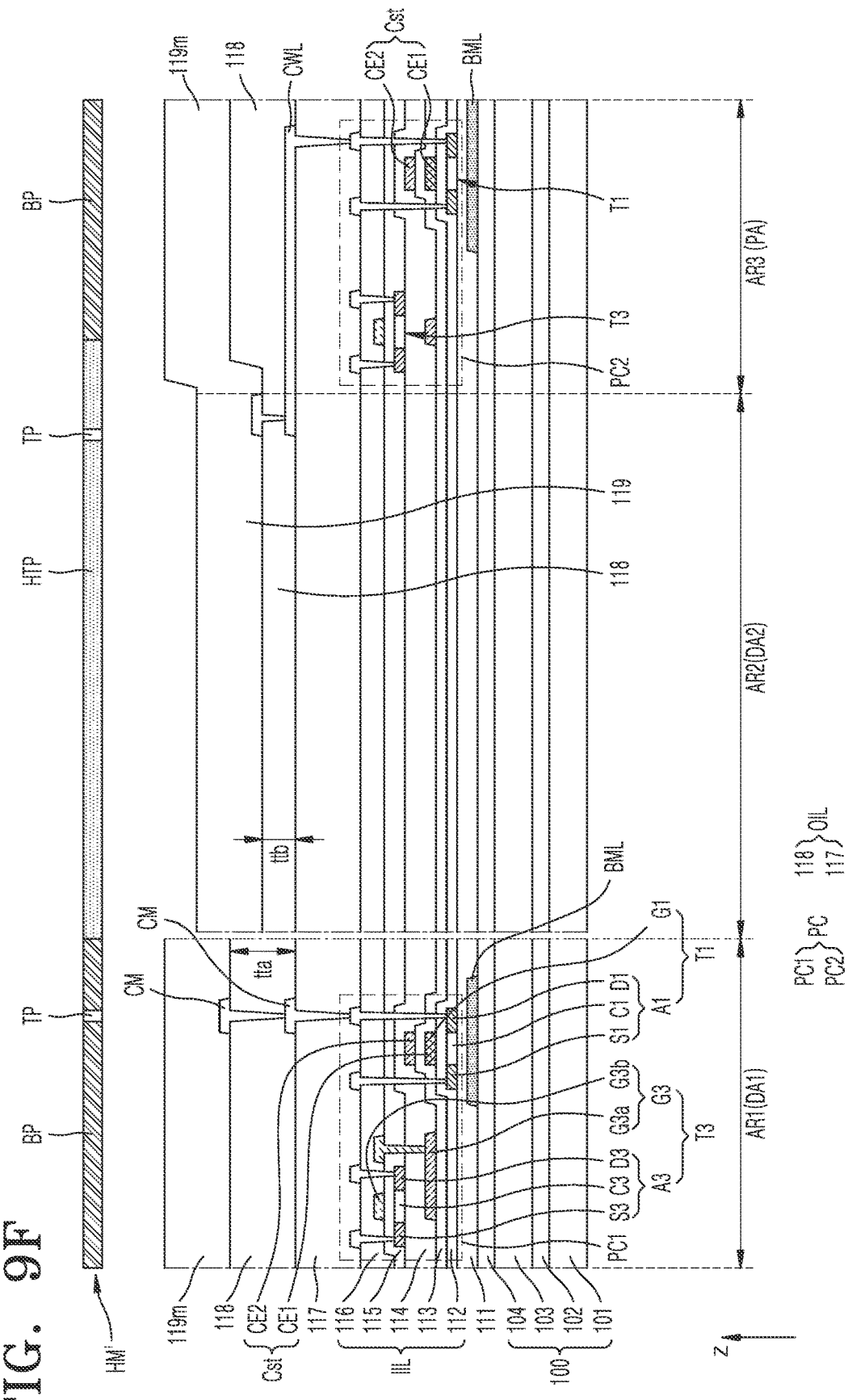

Referring to FIG. 9F, after the contact metal CM and the connection wiring CWL are formed on the second organic layer 118 and/or the first organic layer 117, a second material layer 119m may be formed. The second material layer 119m may be formed through a coating process or a deposition process. The second material layer 119m may cover the first area AR1 and the second area AR2, and may have a substantially uniform thickness. Next, the second material layer 119m may be patterned by using a halftone mask HM', in a similar manner to that of patterning the first material layer 118m as shown in FIG. 9D.

Figure 9G:
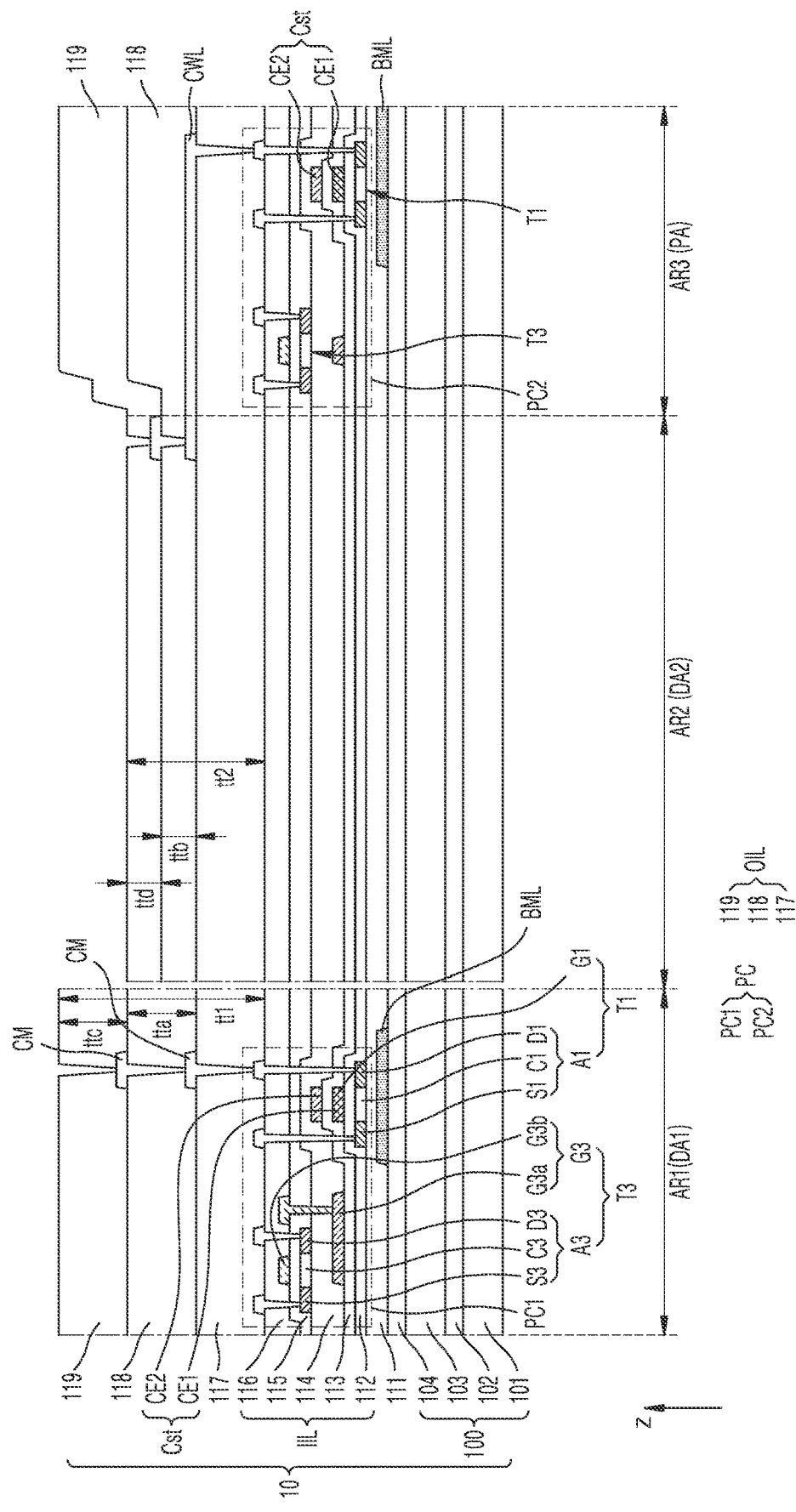

Referring to FIG. 9G, the third organic layer 119 may be formed, by patterning the second material layer 119m (e.g., see FIG. 9F) by using the halftone mask HM' (e.g., see FIG. 9F). A portion corresponding to the semi-transparent portion HTP (e.g., see FIG. 9F) of the halftone mask HM' may be the second area AR2, and a portion corresponding to the light-blocking portion BP (e.g., see FIG. 9F) may be the first area AR1. Accordingly, the third organic layer 119 may be formed so that the thickness ttd of the third organic layer 119 in the second area AR2 is less than the thickness ttc of the third organic layer 119 in the first area AR1. A portion corresponding to the transparent portion TP (e.g., see FIG. 9F) of the halftone mask HM' may be a portion where a contact hole of the third organic layer 119 is located.

Figure 9H:
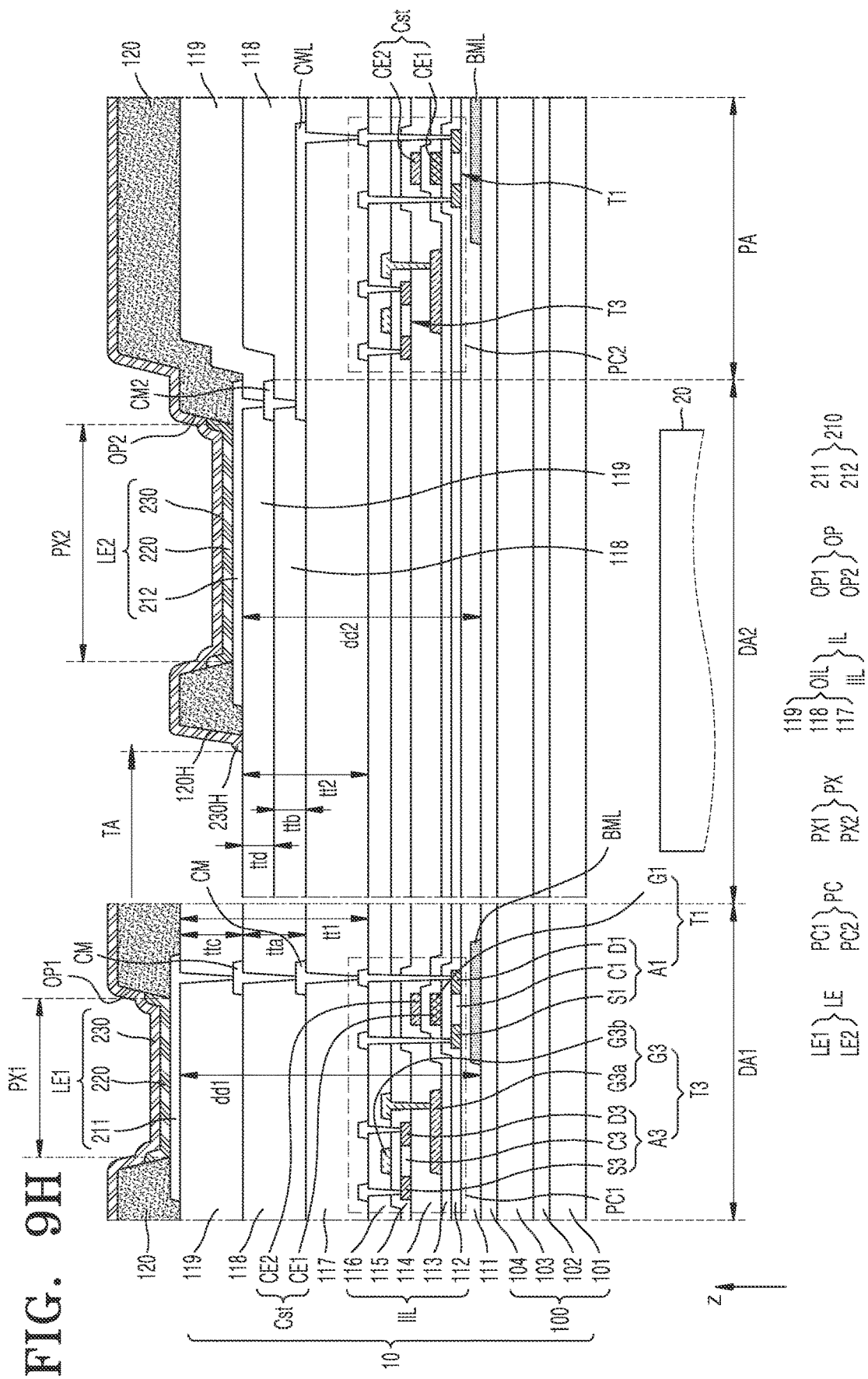

Referring to FIG. 9H, the light-emitting device LE and the pixel PX may be formed, by forming the pixel electrode 210, the pixel-defining film 120, the intermediate layer 220, and the counter electrode 230 on the third organic layer 119.

According to the one or more embodiments, a display apparatus, an electronic device including the same, and a method of manufacturing the display apparatus which may display an image even in an area where an electronic device is located may be provided. Also, a display apparatus, an electronic device including the same, and a method of manufacturing the display apparatus which may minimize or reduce display quality degradation by minimizing or reducing the risk of degradation of a light-emitting device during a manufacturing process may be provided. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various suitable changes in form and details may be made therein without departing from the spirit and scope of the present disclosure as defined by the following claims, and equivalents thereof.

What is claimed is:

1. A display apparatus comprising a first display area, a second display area comprising a transmissive area, and a peripheral area outside the first display area and the second display area, the display apparatus comprising:
a substrate;
a first pixel circuit on the substrate and in the first display area; and
an organic insulating layer on the first pixel circuit and covering the first display area and the second display area,
wherein a thickness of the organic insulating layer in the second display area is less than a thickness of the organic insulating layer in the first display area.

2. The display apparatus of claim 1, wherein the organic insulating layer comprises a first organic layer and a second organic layer on the first organic layer, and
wherein a thickness of the second organic layer in the second display area is less than a thickness of the second organic layer in the first display area.

3. The display apparatus of claim 2, wherein the organic insulating layer further comprises a third organic layer on the second organic layer, and
wherein a thickness of the third organic layer in the second display area is less than a thickness of the third organic layer in the first display area.

4. The display apparatus of claim 2, further comprising:
a first pixel electrode in the first display area, on the organic insulating layer, and electrically connected to the first pixel circuit; and
a second pixel electrode in the second display area and on the organic insulating layer,
wherein a distance between a contact metal on the first organic layer in the first display area and the first pixel electrode is greater than a distance between a connection wiring on the first organic layer in the second display area and the second pixel electrode.

5. The display apparatus of claim 1, further comprising:
a first pixel electrode in the first display area, on the organic insulating layer, and electrically connected to the first pixel circuit; and
a second pixel electrode in the second display area and on the organic insulating layer,
wherein an area of the second pixel electrode is greater than an area of the first pixel electrode in a plane.

6. The display apparatus of claim 5, further comprising a pixel-defining film on the first pixel electrode and the second pixel electrode, the pixel-defining film comprising a first opening and a second opening through which a portion of the first pixel electrode and a portion of the second pixel electrode are respectively exposed,
wherein an area of the second opening is greater than an area of the first opening in a plane.

7. The display apparatus of claim 6, wherein the pixel-defining film comprises a light-blocking material.

8. The display apparatus of claim 5, wherein a distance between the substrate and the second pixel electrode is less than a distance between the substrate and the first pixel electrode.

9. The display apparatus of claim 5, further comprising a second pixel circuit on the substrate, in the peripheral area, and electrically connected to the second pixel electrode.

10. The display apparatus of claim 5, further comprising an intermediate area between the first display area and the second display area, the display apparatus further comprising a second pixel circuit on the substrate, in the intermediate area, and electrically connected to the second pixel electrode.

11. The display apparatus of claim 1, wherein the first pixel circuit comprises:
a first thin-film transistor comprising a first semiconductor layer and a first gate electrode at least partially overlapping the first semiconductor layer; and
a second thin-film transistor comprising a second semiconductor layer comprising a material different from a material of the first semiconductor layer and a second gate electrode at least partially overlapping the second semiconductor layer.

12. The display apparatus of claim 11, wherein the first semiconductor layer of the first thin-film transistor comprises a silicon semiconductor material, and
wherein the second semiconductor layer of the second thin-film transistor comprises an oxide semiconductor material.

13. An electronic device comprising:
a display apparatus comprising a first display area, a second display area comprising a transmissive area, and a peripheral area outside the first display area and the second display area; and an electronic component corresponding to the second display area,
wherein the display apparatus comprises:
a substrate;
a first pixel circuit on the substrate and in the first display area; and
an organic insulating layer on the first pixel circuit and covering the first display area and the second display area, and
wherein a thickness of the organic insulating layer in the second display area is less than a thickness of the organic insulating layer in the first display area.

14. The electronic device of claim 13, wherein the organic insulating layer of the display apparatus comprises a first organic layer and a second organic layer on the first organic layer, and
wherein a thickness of the second organic layer in the second display area is less than a thickness of the second organic layer in the first display area.

15. The electronic device of claim 14, wherein the organic insulating layer of the display apparatus further comprises a third organic layer on the second organic layer, and
wherein a thickness of the third organic layer in the second display area is less than a thickness of the third organic layer in the first display area.

16. The electronic device of claim 13, wherein the display apparatus further comprises:
a first pixel electrode in the first display area, on the organic insulating layer, and electrically connected to the first pixel circuit; and
a second pixel electrode in the second display area and on the organic insulating layer, and
wherein an area of the second pixel electrode is greater than an area of the first pixel electrode in a plane.

17. The electronic device of claim 16, wherein the display apparatus further comprises a pixel-defining film on the first pixel electrode and the second pixel electrode, the pixel-defining film comprising a first opening and a second opening through which a portion of the first pixel electrode and a portion of the second pixel electrode are respectively exposed, and
wherein an area of the second opening is greater than an area of the first opening in a plane.

18. The electronic device of claim 16, wherein a distance between the substrate and the second pixel electrode is less than a distance between the substrate and the first pixel electrode.

19. A method of manufacturing a display apparatus, the method comprising:
preparing a substrate comprising a first area and a second area adjacent to the first area;
forming a first pixel circuit in the first area of the substrate;
forming an organic insulating layer on the first pixel circuit and covering the first area and the second area of the substrate; and
forming a first pixel electrode on the organic insulating layer and in the first area, and a second pixel electrode on the organic insulating layer and in the second area,
wherein the forming the organic insulating layer comprises forming the organic insulating layer using a halftone mask so that a thickness of the organic insulating layer in the second area is less than a thickness of the organic insulating layer in the first area.

20. The method of claim 19, wherein the forming the organic insulating layer comprises:
forming a first organic layer; and
forming a second organic layer on the first organic layer using a halftone mask so that a thickness of the second organic layer in the second area is less than a thickness of the second organic layer in the first area.

21. The method of claim 20, wherein the forming the organic insulating layer further comprises forming a third organic layer on the second organic layer using a halftone mask so that a thickness of the third organic layer in the second area is less than a thickness of the third organic layer in the first area.

22. The method of claim 19, wherein an area of the second pixel electrode is greater than an area of the first pixel electrode in a plane.

23. The method of claim 19, further comprising a pixel-defining film on the first pixel electrode and the second pixel electrode, the pixel-defining film comprising a first opening and a second opening through which a portion of the first pixel electrode and a portion of the second pixel electrode are respectively exposed,
wherein an area of the second opening is greater than an area of the first opening in a plane.

* * * * *